United States Patent
Choi et al.

(10) Patent No.: US 8,368,138 B2
(45) Date of Patent: Feb. 5, 2013

(54) NON-VOLATILE MEMORY DEVICES AND METHODS OF MANUFACTURING THE SAME

(75) Inventors: Yong-Lack Choi, Seoul (KR); Sunghoi Hur, Seoul (KR); Jaeduk Lee, Seongnam-si (KR); Jungdal Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 12/884,668

(22) Filed: Sep. 17, 2010

(65) Prior Publication Data

US 2011/0073930 A1     Mar. 31, 2011

(30) Foreign Application Priority Data

Sep. 25, 2009  (KR) .................... 10-2009-0091227

(51) Int. Cl.
*H01L 29/788* (2006.01)
(52) U.S. Cl. ........ 257/321; 257/314; 257/315; 257/316; 257/E29.129; 257/E29.132; 257/E29.3; 438/257; 438/261; 438/264; 438/265
(58) Field of Classification Search .......... 257/314–316, 257/321, E29.129, E29.3, 324–326, E29.132; 438/257, 261, 264, 265
See application file for complete search history.

(56) References Cited

U.S. PATENT DOCUMENTS

| 5,429,969 | A | * | 7/1995 | Chang | 438/267 |
| 6,063,662 | A | * | 5/2000 | Bui | 438/257 |
| 6,337,250 | B2 | * | 1/2002 | Furuhata | 438/301 |
| 2006/0001053 | A1 | * | 1/2006 | Wang | 257/214 |
| 2007/0148867 | A1 | | 6/2007 | Park et al. | |
| 2007/0249120 | A1 | | 10/2007 | Ishida et al. | |

FOREIGN PATENT DOCUMENTS

| JP | 2007-294537 | 11/2007 |
| KR | 10-0666615 | 1/2007 |
| KR | 10-0673021 | 1/2007 |
| KR | 10-2007-0104276 | 10/2007 |

\* cited by examiner

*Primary Examiner* — Matthew E Warren
*Assistant Examiner* — John Lin
(74) *Attorney, Agent, or Firm* — Harness, Dickey & Pierce, P.L.C.

(57) ABSTRACT

Semiconductor devices and methods of forming the same. The semiconductor devices include a tunnel insulation layer on a substrate, a floating gate on the tunnel insulation layer, a gate insulation layer on the floating gate, a low-dielectric constant (low-k) region between the top of the floating gate and the gate insulation layer, the low-k region having a lower dielectric constant than a silicon oxide, and a control gate on the gate insulation layer.

10 Claims, 30 Drawing Sheets

NON-VOLATILE MEMORY DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2009-0091227, filed on Sep. 25, 2009, in the Korean Intellectual Property Office (KIPO), the entire contents of which is incorporated herein by reference.

BACKGROUND

Example embodiments of the inventive concepts relate to semiconductor devices and methods of manufacturing the same, and more particularly, to non-volatile memory devices including floating gates and methods of manufacturing the same.

A non-volatile memory device retains its stored data even when an external power supply is cut off. A flash memory device including a floating gate may be a typical example of a non-volatile memory device. The flash memory device may be a highly-integrated device obtained by combining advantages of an Erasable Programmable Read Only Memory (EPROM) and an Electrically Erasable Programmable Read Only Memory (EEPROM). The flash memory device may be classified into a NOR type and/or a NAND type. The flash memory device may store data of logic 0 or logic 1 by storing charges in a floating gate or emitting the stored charges from the floating gate.

SUMMARY

Example embodiments of the inventive concepts may provide non-volatile memory devices that alleviate leakage current increases caused by electric fields concentrating on the top of floating gates and methods of manufacturing the same.

Example embodiments of the inventive concepts may provide non-volatile memory devices including a tunnel insulation layer on a substrate, a floating gate on the tunnel insulation layer, a gate insulation layer on the floating gate, a low-dielectric constant (low-k) region, between the top of the floating gate and the gate insulation layer, having a lower k than a silicon oxide, a control gate on the gate insulation layer.

In some embodiments, the low-k region may be an air spacer. In other embodiments, the low-k region may include a silicon oxide fluoride or a silicon oxide carbide. In still other embodiments, the bottom of the low-k region may be lower than the top of the floating gate. In even other embodiments, the low-k region may have a form surrounding the top of the floating gate. In yet other embodiments, the width of the low-k region may be broader than that of the top of the floating gate in a channel width direction. In further embodiments, the width of the low-k region may be broader than that of the top of the floating gate in a channel length direction. In still further embodiments, the devices may further include an insulation spacer on the sidewall of the floating gate, wherein the low-k region extends between the insulation spacer and the floating gate.

Example embodiments of the inventive concepts may provide non-volatile memory devices including a substrate, a tunnel insulation layer on the substrate, a floating gate on the tunnel insulation layer, a gate insulation layer on the floating gate, a low-dielectric constant (low-k) region between the floating gate and the gate insulation layer, a dielectric constant of the low-k region less than a dielectric constant of the gate insulation layer, and a control gate on the gate insulation layer.

Example embodiments of the inventive concepts may provide methods of forming a non-volatile memory device, the methods including forming a sacrificial pattern on a floating gate, forming a gate insulation layer on the sacrificial pattern, forming a control gate on the gate insulation layer, exposing a sidewall of the sacrificial pattern by patterning the floating gate, the sacrificial pattern, the gate insulation layer, and the control gate, and forming an air spacer by removing the exposed sacrificial pattern.

The sacrificial pattern may include silicon germanium. The removing of the exposed sacrificial pattern may include etching the sacrificial pattern by using an etchant with an etching selectivity with respect to the sacrificial pattern. The methods may include filling a low-k material in the air spacer, the low-k material having a lower k than a silicon oxide.

The low-k material may include a silicon oxide fluoride or a silicon oxide carbide. The forming of the air spacer may include partially etching the gate insulation layer. The forming of the air spacer may include partially etching the exposed sidewall of the floating gate. The forming of the air spacer may include partially etching the top of the floating gate.

Example embodiments of the inventive concepts may provide methods of manufacturing a non-volatile memory device, the methods including forming a floating gate, forming a sacrificial pattern on the floating gate, forming a gate insulation layer on the sacrificial pattern, forming a control gate on the gate insulation layer, exposing a sidewall of the sacrificial pattern by patterning the floating gate, the sacrificial pattern, the gate insulation layer, and the control gate, and forming an air spacer by removing at least part of the exposed sacrificial pattern.

Example embodiments of the inventive concepts may provide methods of forming a non-volatile memory device, the methods including forming a low-k region on a floating gate, the low-k region having a lower k than a silicon oxide, forming a gate insulation layer on the low-k region, and forming a control gate on the gate insulation layer.

The forming of the low-k region may include forming a low-k layer on the floating gate, patterning the low-k layer by a photo process and patterning the floating gate by using the patterned low-k layer as a mask. The patterning of the low-k layer by the photo process may include exposure and develop processes. The low-k layer may include a low-k material.

Example embodiments of the inventive concepts may provide methods of manufacturing a non-volatile memory device, the methods including forming a floating gate, forming a low dielectric constant (low-k) region on the floating gate, a dielectric constant of the low-k region less than a dielectric constant of a silicon oxide, forming a gate insulation layer on the low-k region, and forming a control gate on the gate insulation layer.

BRIEF DESCRIPTION OF THE DRAWINGS

Example embodiments will be more clearly understood from the following brief description taken in conjunction with the accompanying drawings.

FIGS. 1-8 are diagrams illustrating non-volatile memory devices and methods of manufacturing the same according to example embodiments of the inventive concepts;

FIGS. 9 and 10 are diagrams illustrating non-volatile memory devices and methods of manufacturing the same according to example embodiments of the inventive concepts;

FIGS. 11-13 are diagrams illustrating non-volatile memory devices and methods of manufacturing the same according to example embodiments of the inventive concepts;

FIGS. 14-18 are diagrams illustrating non-volatile memory devices and methods of manufacturing the same according to example embodiments of the inventive concepts;

FIGS. 19-25 are diagrams illustrating non-volatile memory devices and methods of manufacturing the same according to example embodiments of the inventive concepts;

FIGS. 26-30 are diagrams illustrating non-volatile memory devices and methods of manufacturing the same according to example embodiments of the inventive concepts;

FIG. 31 is a block diagram illustrating an electronic system including a non-volatile memory device according to example embodiments of the inventive concepts; and FIG. 32 is a block diagram illustrating a memory card including a non-volatile memory device according to example embodiments of the inventive concepts.

Figure 1:
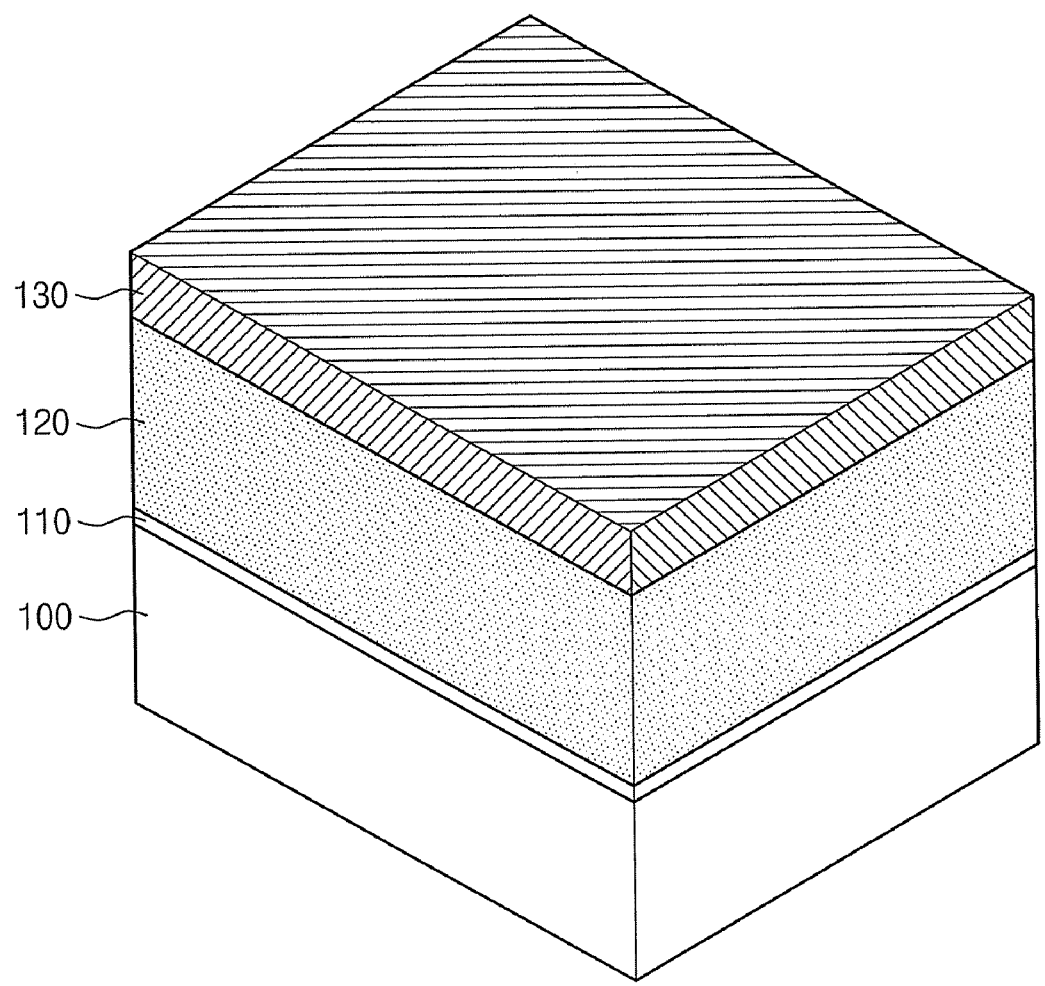
FIGS. 1-32 represent non-limiting, example embodiments as described herein.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular form's "a," "an" and "the" are intended to include the plural forms as well, unless the context clearly indicates otherwise. It will be further understood that the teens "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-8 are diagrams illustrating non-volatile memory devices and methods of manufacturing the same according to example embodiments of the inventive concepts. Referring to FIG. 1, a first insulation layer 110 may be on a substrate 100. The substrate 100 may include, for example, a semiconductor based structure (e.g., a structure including a silicon surface). This semiconductor based structure may be, for example, a silicon epitaxial layer supported by silicon, a silicon-on-insulator (SOI), and/or a semiconductor structure. The first insulation layer 110 may include, for example, a silicon oxide layer. A first conductive layer 120 may be on the first insulation layer 110. The first conductive layer 120 may be, for example, polysilicon doped with an impurity. A sacrificial layer 130 may be on the first conductive layer 120. The sacrificial layer 130 may be a layer having etch selectivity with respect to the first conductive layer 120. The sacrificial layer 130 may be, for example, silicon germanium SiGex.

The first insulation layer 110 may be faulted by, for example, a thermal oxidation process. The sacrificial layer 130 may be formed by, for example, a chemical vapor deposition (CVD) process.

Figure 2:
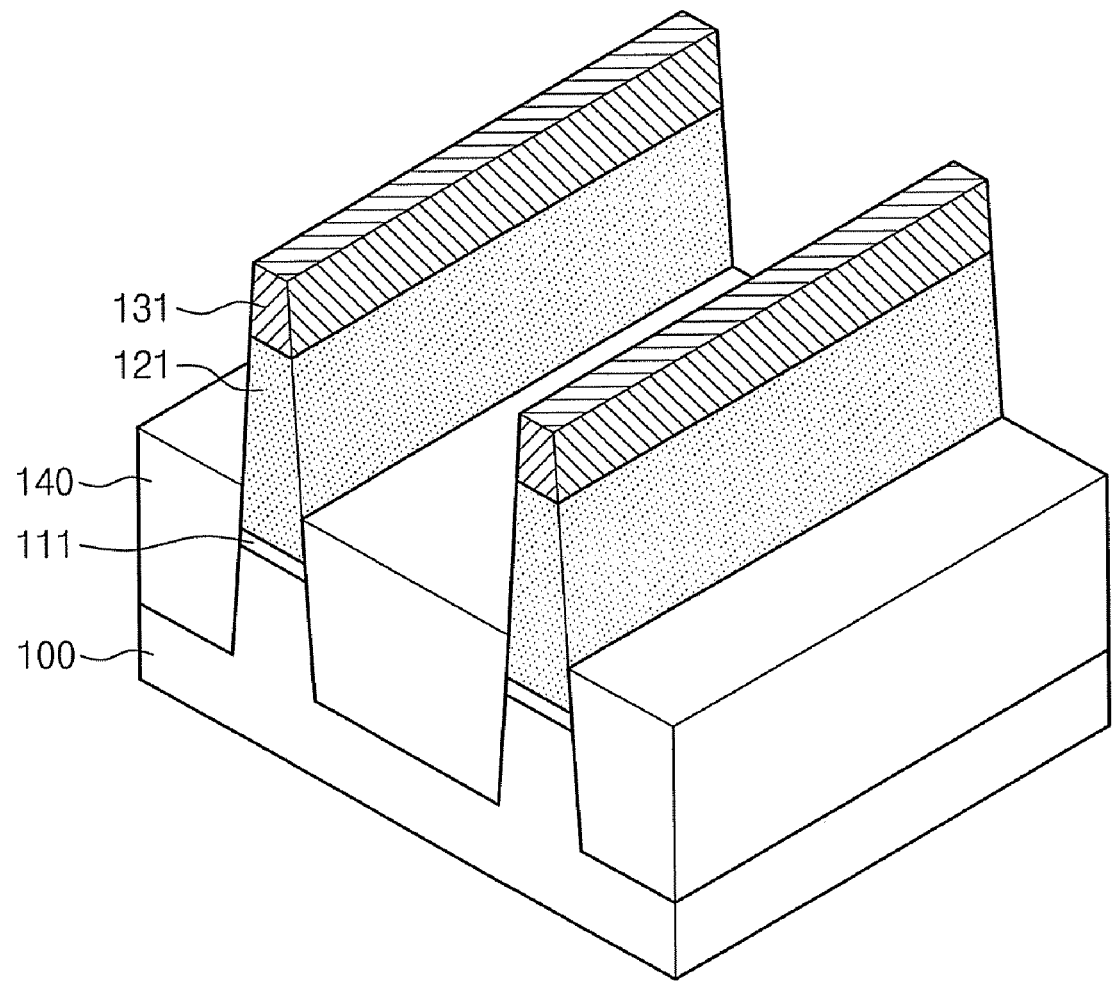

Referring to FIG. 2, the substrate 100, the first insulation layer 110, the first conductive layer 120, and the sacrificial layer 130 may be patterned. A tunnel insulation layer 111, a preliminary floating gate 121, and a preliminary sacrificial pattern 131 may be formed by the patterning. A device isolation layer 140 may be in a recess region of the patterned structure. The device isolation layer 140 may define an active region. The device isolation layer 140 may be, for example, a silicon oxide layer which is formed using a high density plasma CVD method with an excellent gap-fill property.

Figure 3:
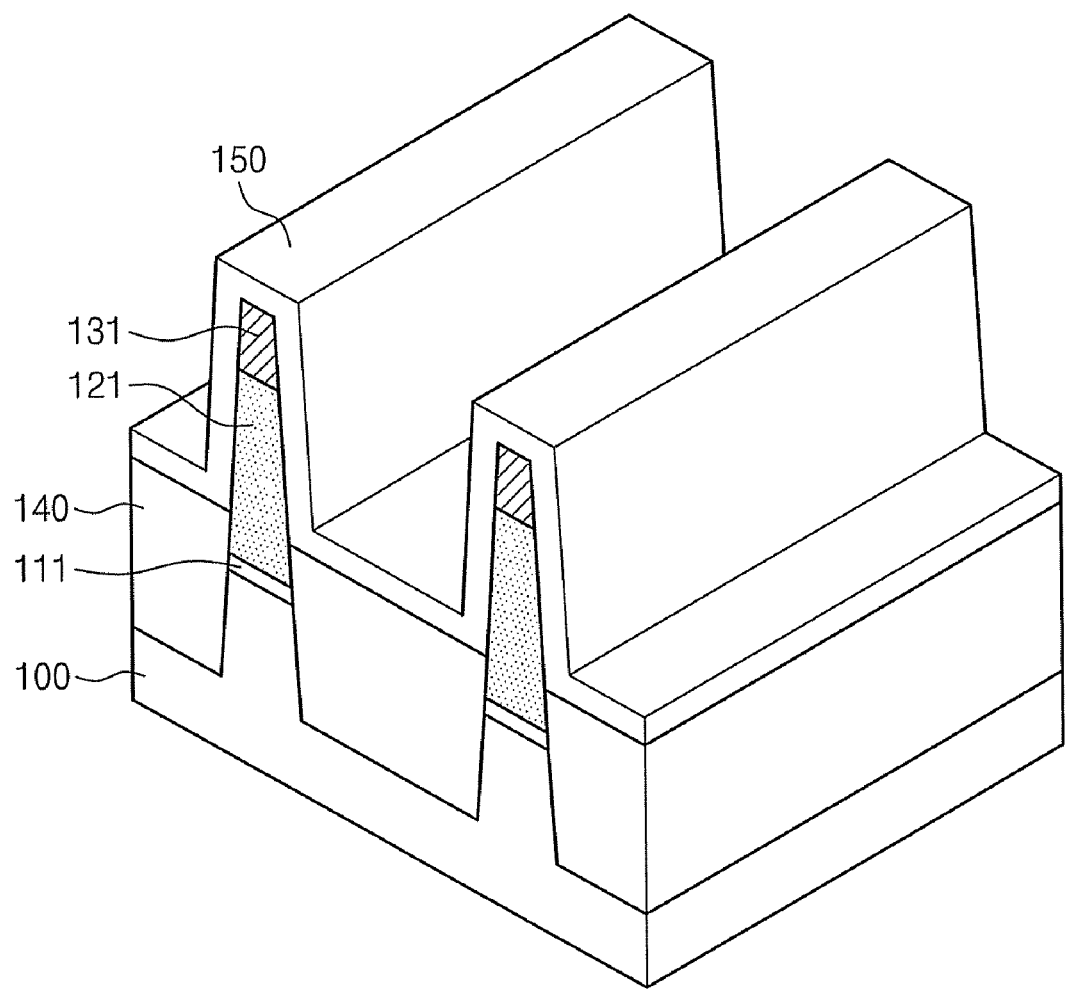
Figure 4:
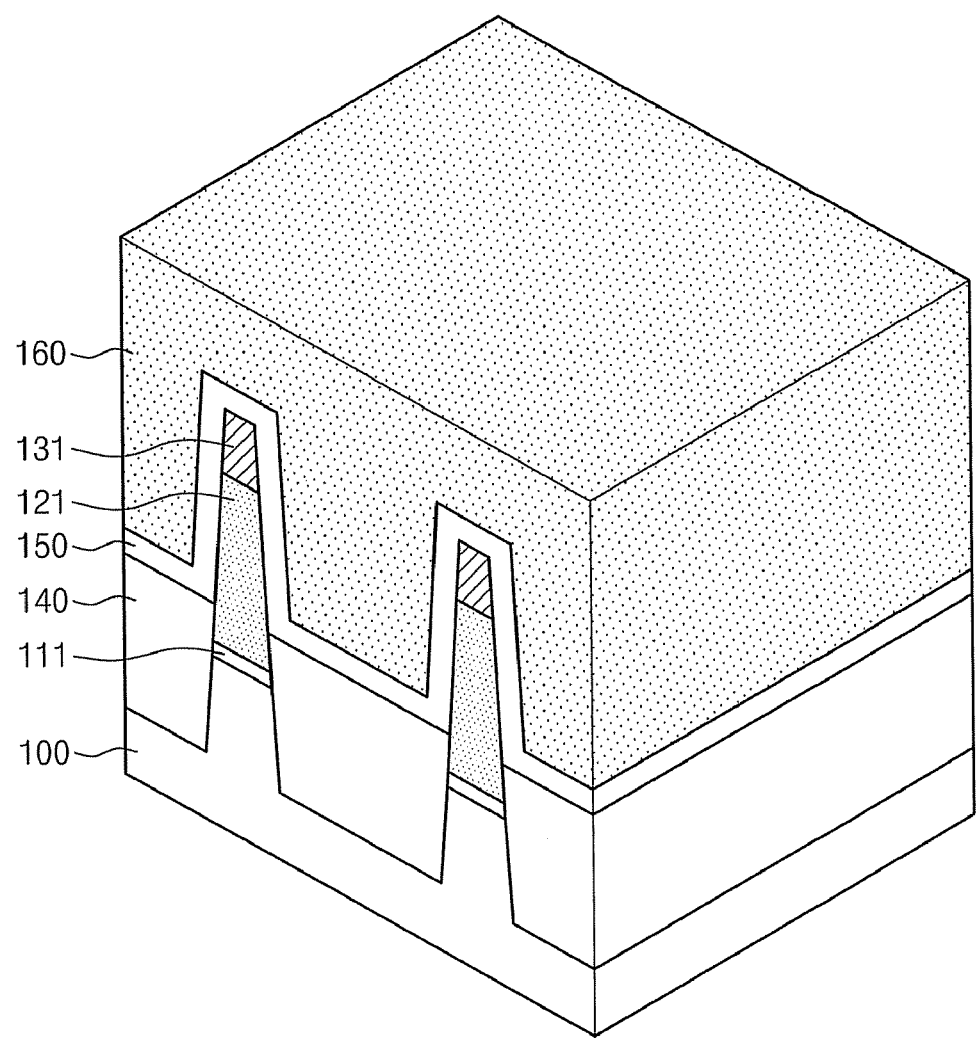

Referring to FIG. 3, a second insulation layer 150 may be on the device isolation layer 140, the preliminary floating gate 121, and the preliminary sacrificial pattern 131. The second insulation layer 150 may be, for example, an oxide-nitride-oxide (ONO) layer. The second insulation layer 150 may be uniformly deposited on an uneven side of the preliminary floating gate 121. Referring to FIG. 4, a second conductive layer 160 may be on the second insulation layer 150. The second conductive layer 160 may be, for example, a doped polysilicon layer or a doped polycide layer.

Figure 5:
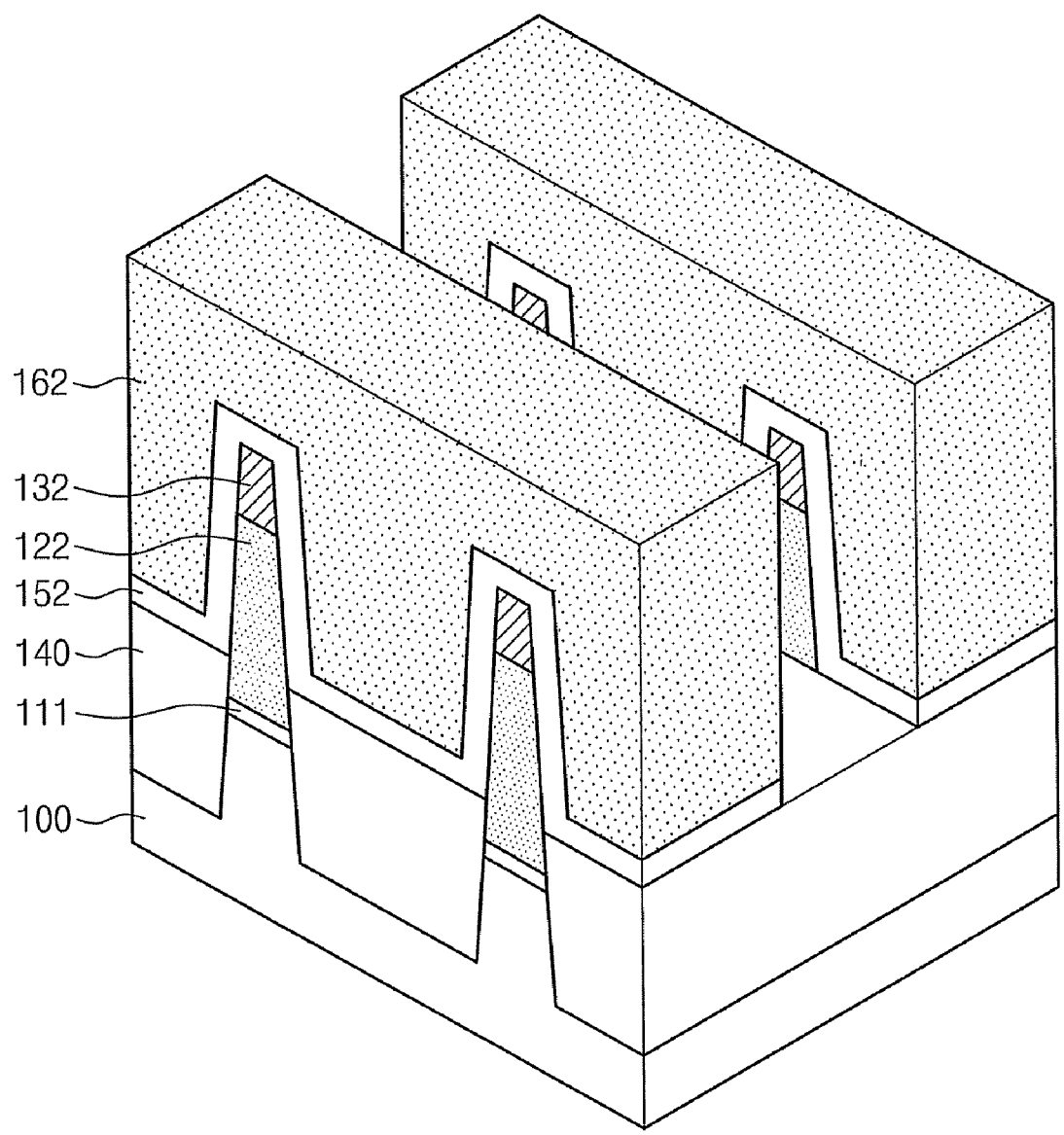
Figure 6:
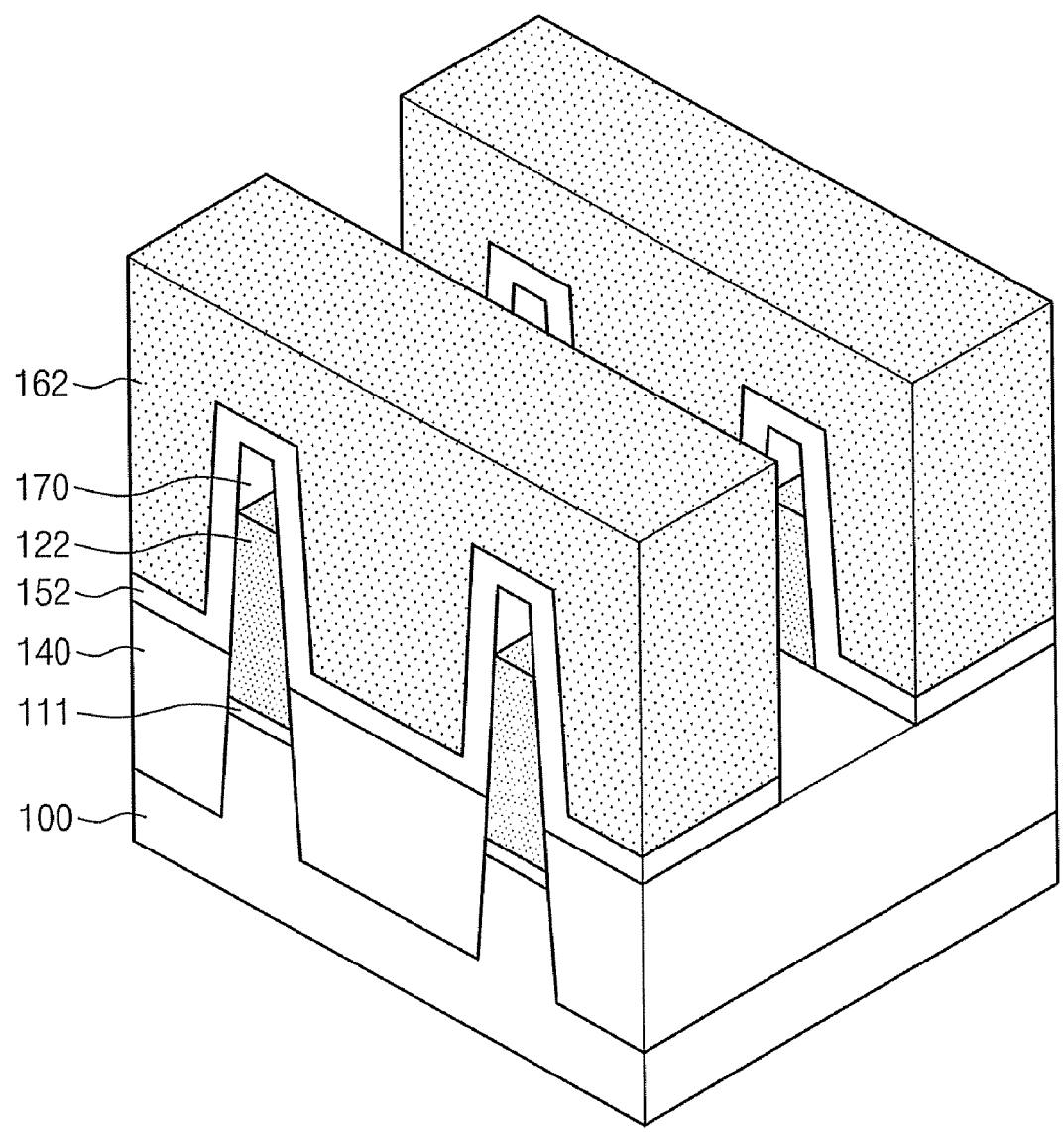

Referring to FIG. 5, the preliminary floating gate 121, the preliminary sacrificial pattern 131, the second insulation layer 150, and the second conductive layer 160 may be patterned. A floating gate 122, a sacrificial pattern 132, a gate insulation layer 152, and a control gate 162 may be formed by the patterning. A sidewall of the sacrificial pattern 132 may be exposed by the patterning. Referring to FIG. 6, an air spacer 170 may be formed by, for example, etching the sacrificial pattern 132. The sacrificial pattern 132 may be etched using, for example, a selective etchant. For example, the etchant may be a poly etchant. At least a portion of the sacrificial pattern 132 may be removed by the etchant to form an empty space.

Figure 7:
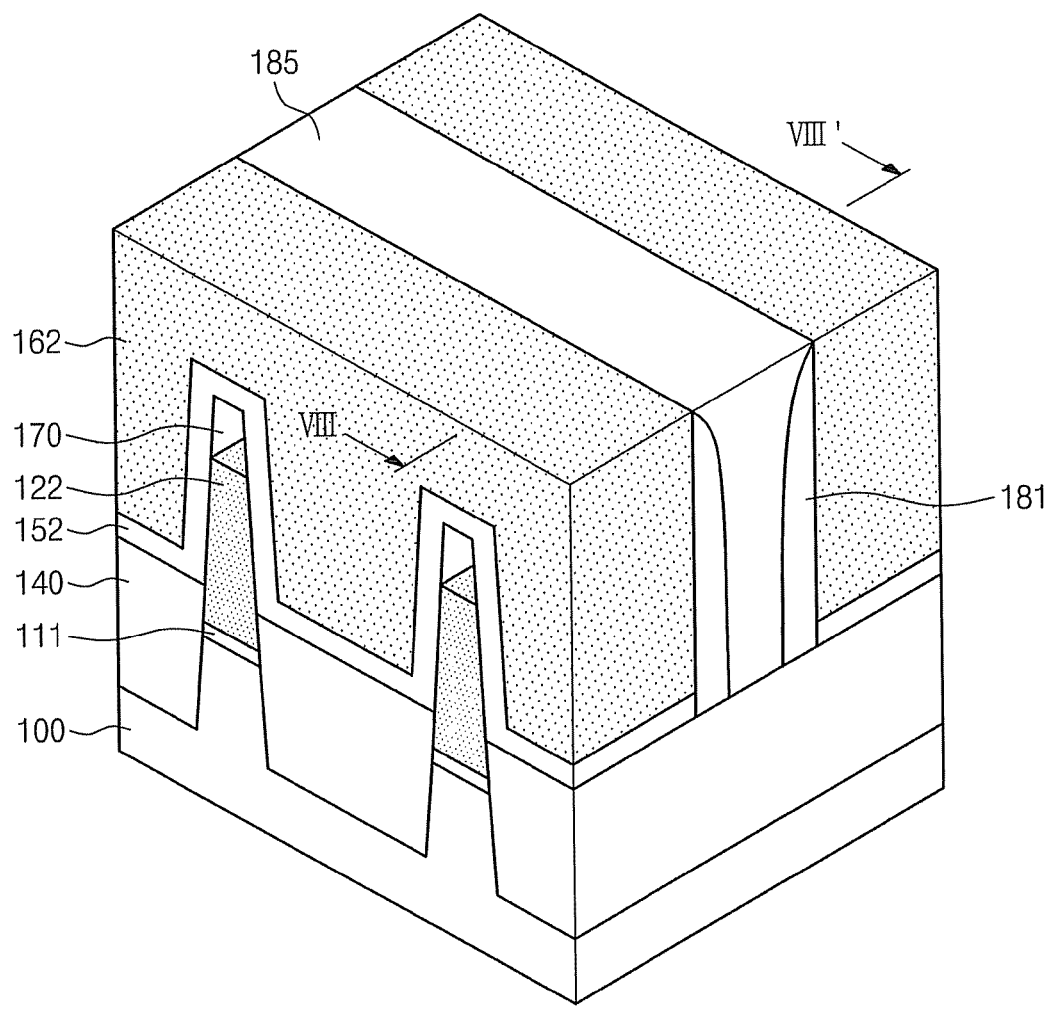
Figure 8:
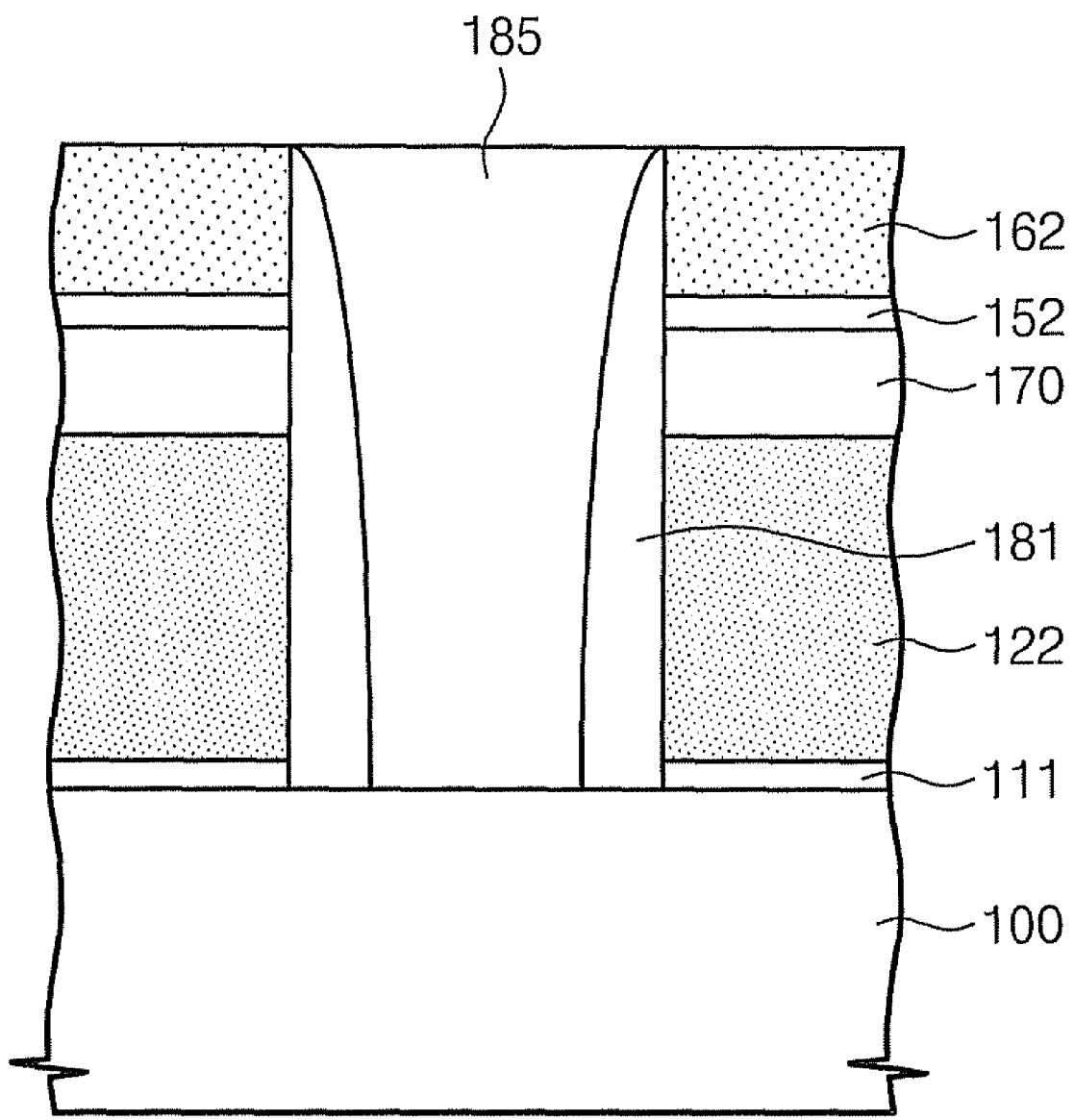

FIG. 8 is a cross-sectional view taken along the line VIII-VIII' of FIG. 7. Referring to FIGS. 7 and 8, an insulation spacer 181 may be on a sidewall of a recess region formed by the patterning. The insulation spacer 181 may be, for example, a silicon nitride. A third insulation layer 185 may be in the recess region. The third insulation layer 185 may be, for example, a silicon oxide layer.

A non-volatile memory device according to example embodiments of the inventive concepts may provide an air spacer (e.g., an air spacer 170) between a floating gate (e.g., a floating gate 122) and a gate insulation layer (e.g., gate insulation layer 152). As design rules are reduced, a narrowing of the top surface of a floating gate may occur. Control gate electric fields may concentrate on the top of the floating gate and a leakage current may increase. According to example embodiments of the inventive concepts, a non-volatile memory device may include a low-dielectric constant (hereinafter referred to as low-k) air spacer 170 to prevent and/or reduce the electric fields that may concentrate on a top surface of a floating gate.

Figure 9:
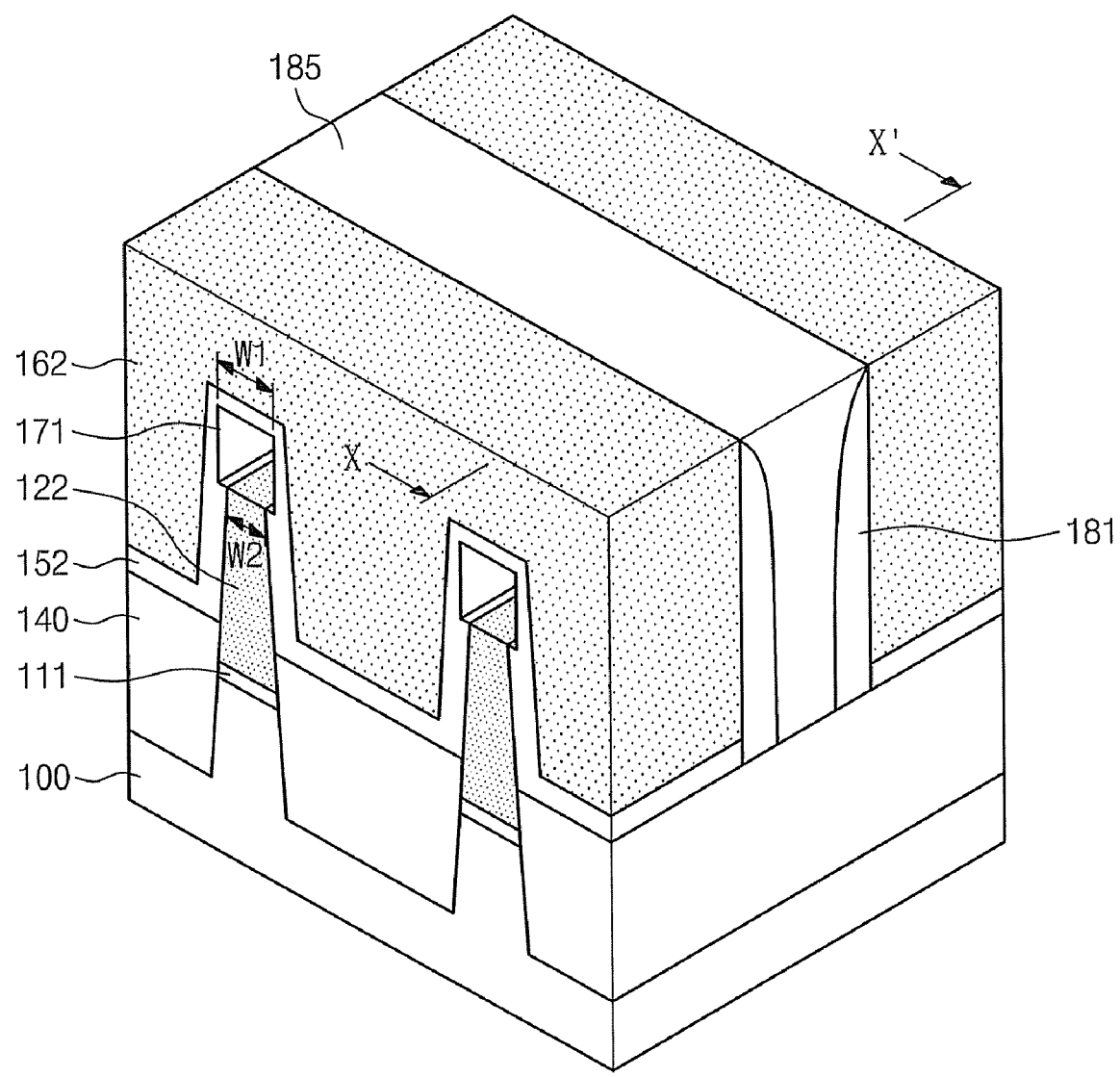
Figure 10:
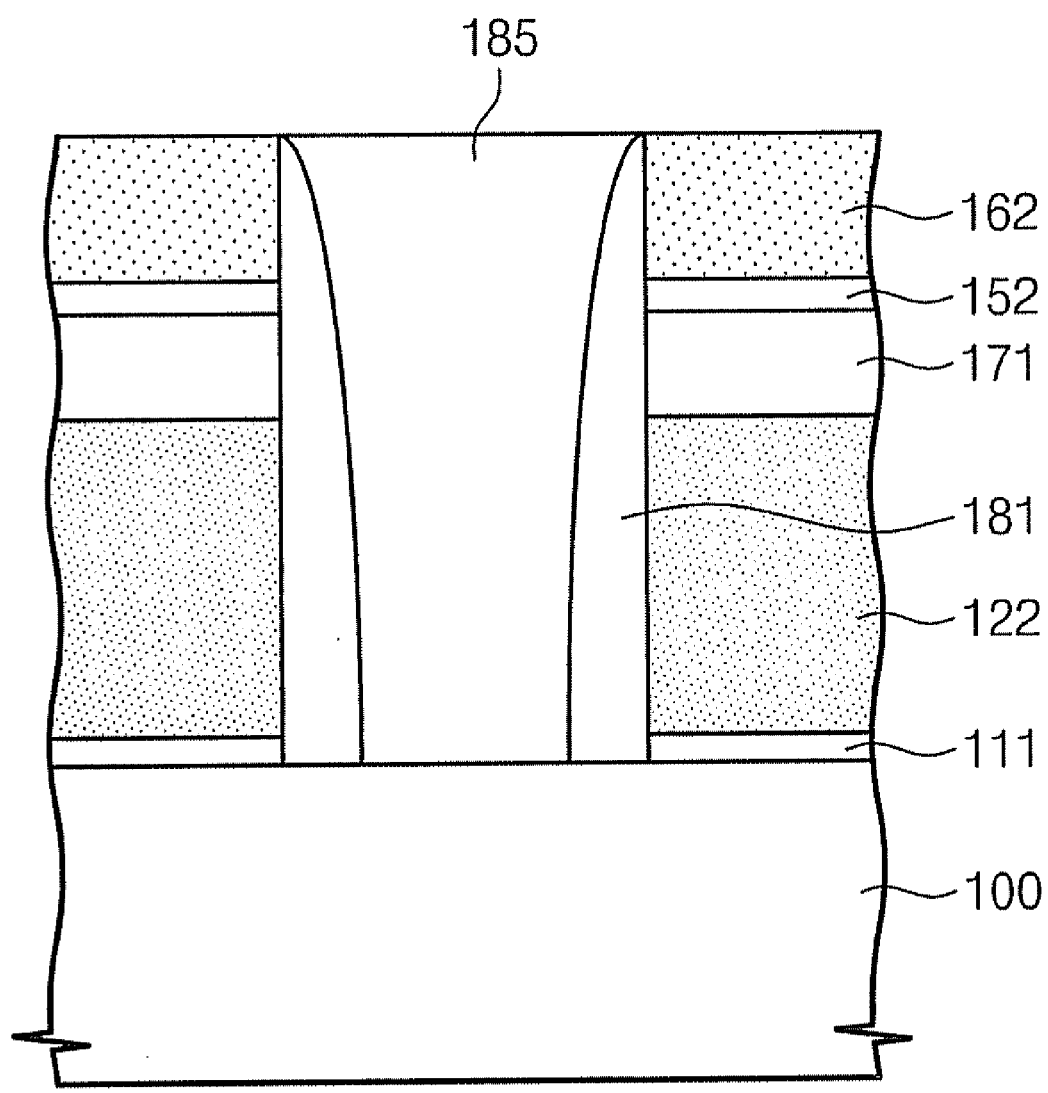

FIGS. 9 and 10 are diagrams illustrating a non-volatile memory device and methods of manufacturing the same according to example embodiments of the inventive concepts. FIG. 10 is a cross-sectional view taken along line X-X' of FIG. 9. Example embodiments of the inventive concepts illustrated in FIGS. 9 and 10 may be similar to example embodiments illustrated in FIGS. 1-8, and may differ with respect to methods of forming a low-k region. Accordingly, like features may be represented by like reference characters and description thereof may be omitted.

Referring to FIGS. 9 and 10, an air spacer 171 may be between a floating gate 122 and a gate insulation layer 152. A portion of the gate insulation layer 152 may be etched together with a sacrificial pattern (not shown). The width W1 of the air spacer 171 may be greater than the width W2 of a top surface of the floating gate 122 in a channel width direction (perpendicular to X-X'). The forming of the air spacer 171 is not limited to the form shown in FIGS. 9 and 10. The form of the air spacer 171 may be achieved by, for example, adjusting an etch profile (e.g., with a poly etchant). During an etch process of the sacrificial pattern the top of the floating gate may be partially etched.

Figure 11:
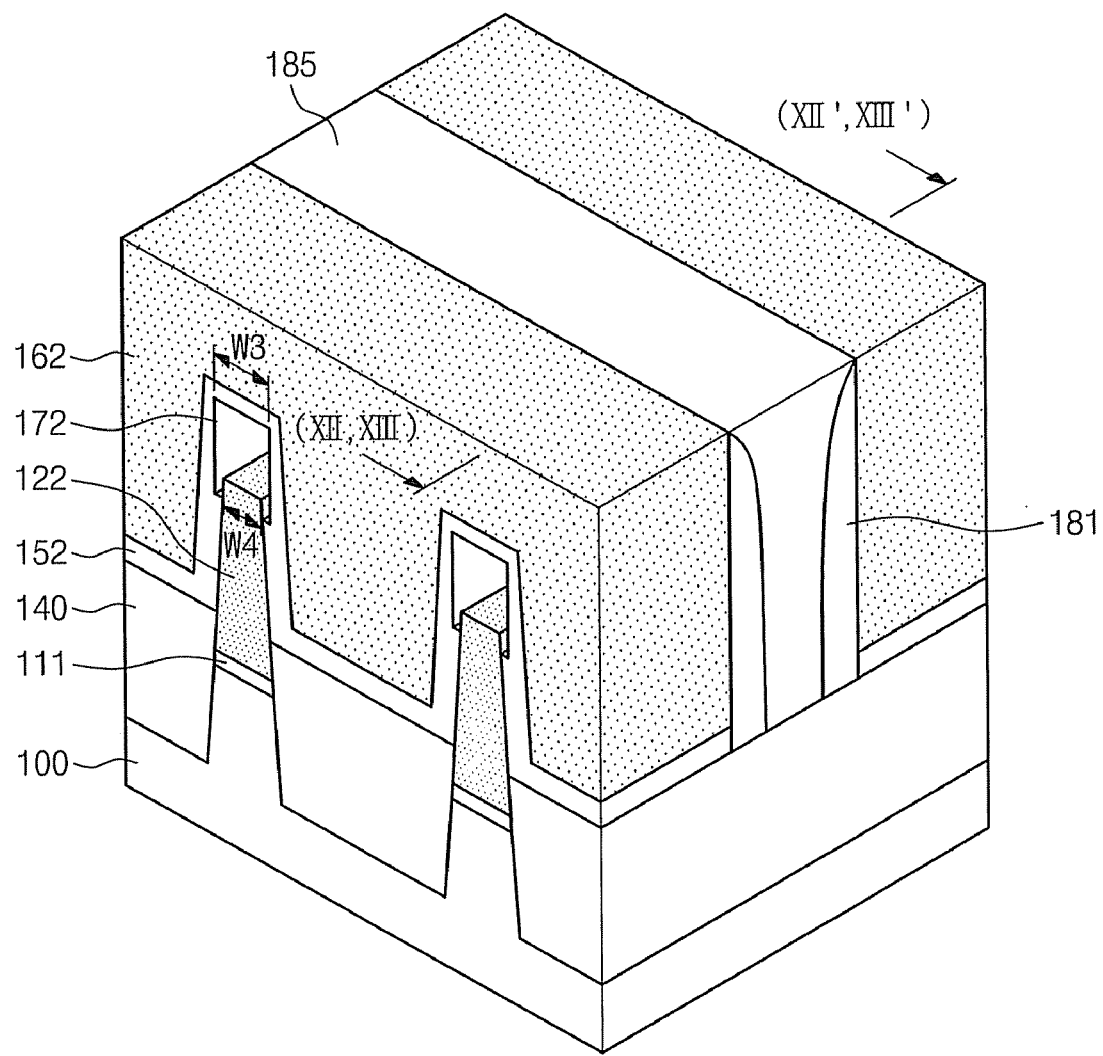
Figure 12:
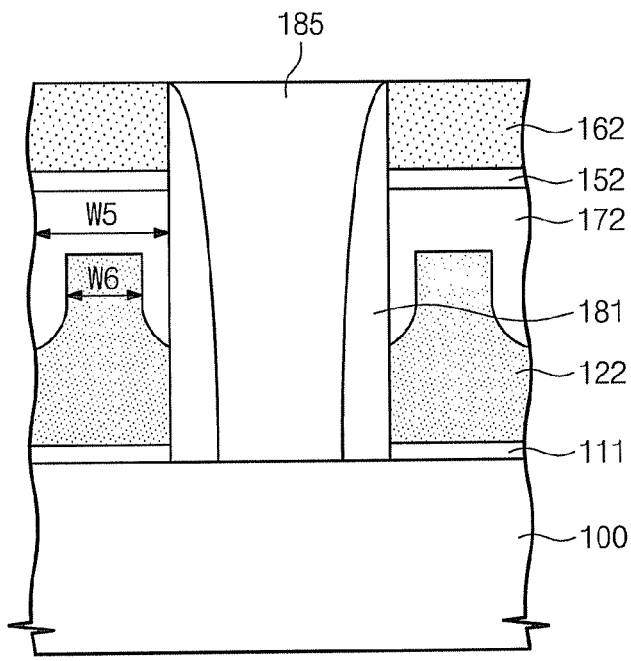
Figure 13:
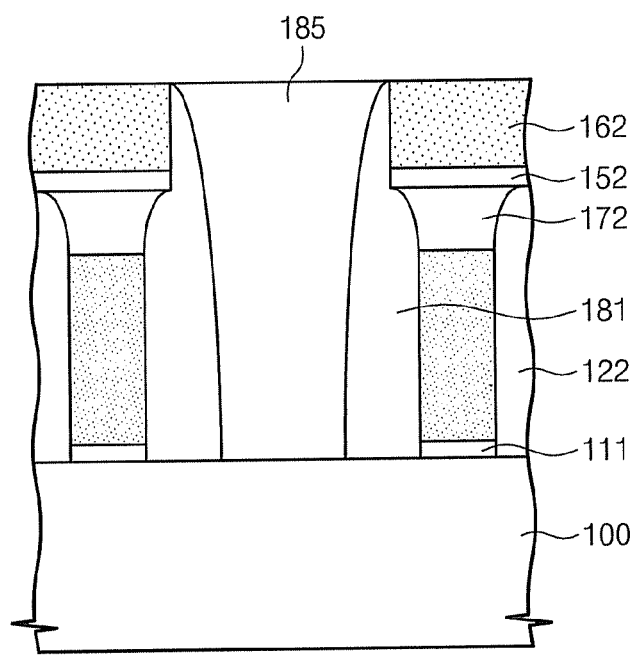

FIGS. 11-13 are diagrams illustrating non-volatile memory devices and methods of manufacturing the same according to example embodiments of the inventive concepts. FIGS. 12 and 13 are cross-sectional views taken along the line (XII,XIII)-(XII,XIII)' of FIG. 11. Example embodiments of the inventive concepts illustrated in FIGS. 11-13 may be similar to example embodiments illustrated in FIGS. 1-8, and may differ with respect to methods of forming a low-k region. Accordingly, like features may be represented by like reference characters and description thereof may be omitted.

Referring to FIGS. 11 and 13, an air spacer 172 may be between a floating gate 122 and a gate insulation layer 152. A portion of the gate insulation layer 152 may be etched together with a sacrificial pattern (not shown). The width W3 of the air spacer 172 may be greater than the width W4 of the top surface of the floating gate 122 in a channel width direction (perpendicular to (XII,XIII)-(XII,XIII)'). The bottom of the air spacer 172 may be below the top of the floating gate 122.

Referring to FIGS. 11 and 12, during an etch process of the sacrificial pattern an exposed sidewall of the floating gate 122 may be partially etched. As shown in FIG. 12, the width W5 of the air spacer 172 may be greater than the width W6 of the top surface of the floating gate 122 in a channel length direction (direction of (XII,XIII)-(XII,XIII)'). The air spacer 172 may extend between the insulation spacer 181 and the floating gate 122. The air spacer 172 may not extend between the insulation spacer 181 and the floating gate 122 as shown in FIG. 13.

FIGS. 14-18 are diagrams illustrating non-volatile memory devices and methods of manufacturing the same according to example embodiments of the inventive concepts. Example embodiments of the inventive concepts illustrated in FIGS. 14-18 may be similar to example embodiments illustrated in FIGS. 1-8, and may differ with respect to methods of forming a low-k region. Accordingly, like features may be represented by like reference characters and description thereof may be omitted.

Figure 14:
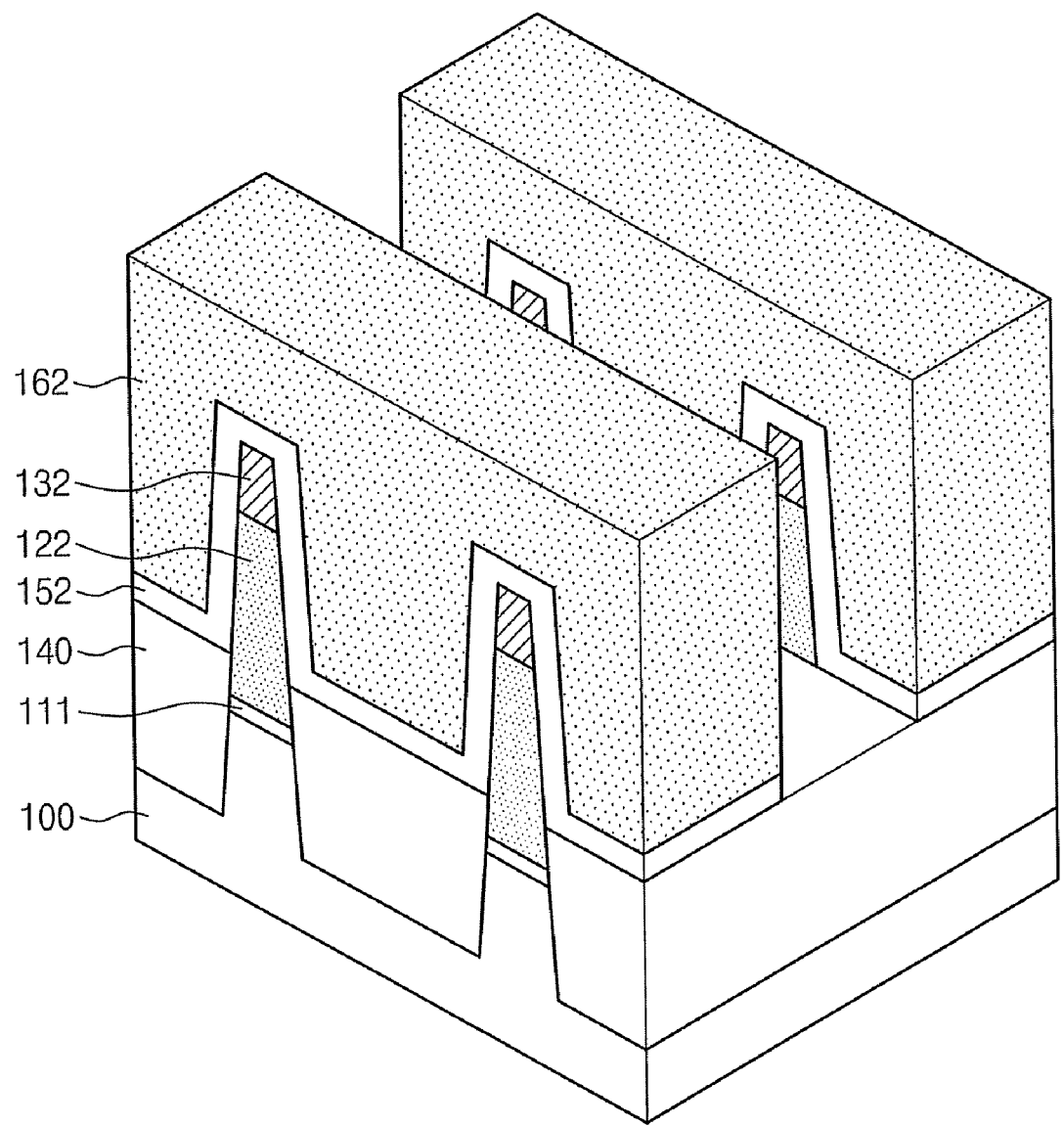

Referring to FIG. 14, a tunnel insulation layer 111 and a device isolation layer 140 may be on a substrate 100. A floating gate 122, a sacrificial pattern 132, a gate insulation layer 152, and a control gate 162 may be on the substrate 100. The tunnel insulation layer 111, the device isolation layer 140, the floating gate 122, the sacrificial pattern 132, the gate insulation layer 152, and the control gate 162 may be formed according to the methods described with reference to FIGS. 1-5. However, example embodiments of the inventive concepts are not so limited and other formation processes are contemplated.

Figure 15:
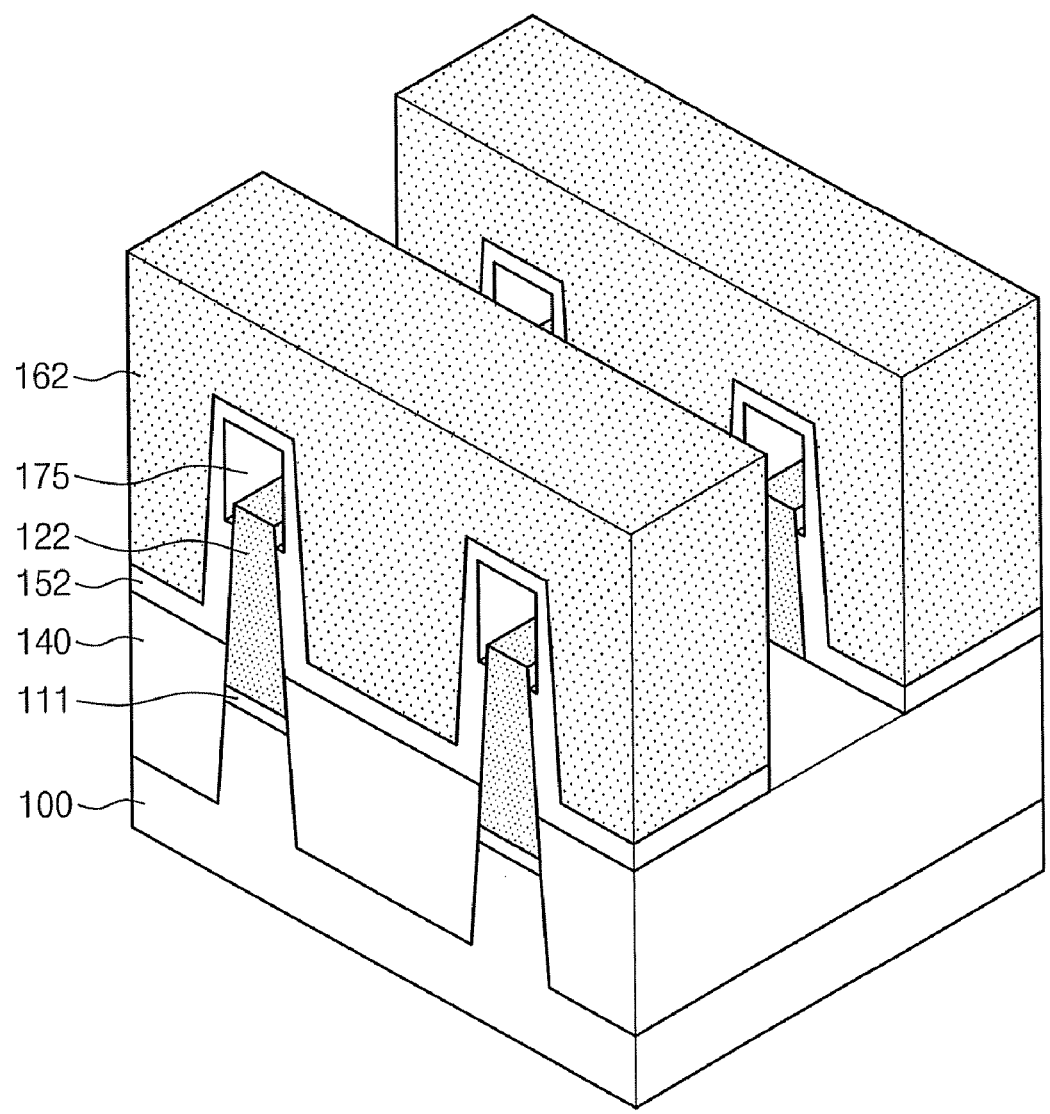

Referring to FIG. 15, an air spacer 175 may be formed by, for example, etching the sacrificial pattern 132. The sacrificial pattern 132 may be etched using an etchant having etch selectivity. For example, the etchant may be a poly etchant. At least a portion of the sacrificial pattern 132 may be etched to form an empty space. A portion of the gate insulation layer 152 may be etched together with the sacrificial pattern 132. The width of the air spacer 175 may be greater than the width of the top surface of the floating gate 122 in a channel width direction. The bottom surface of the air spacer 175 may be below the top surface of the floating gate 122.

Figure 16:
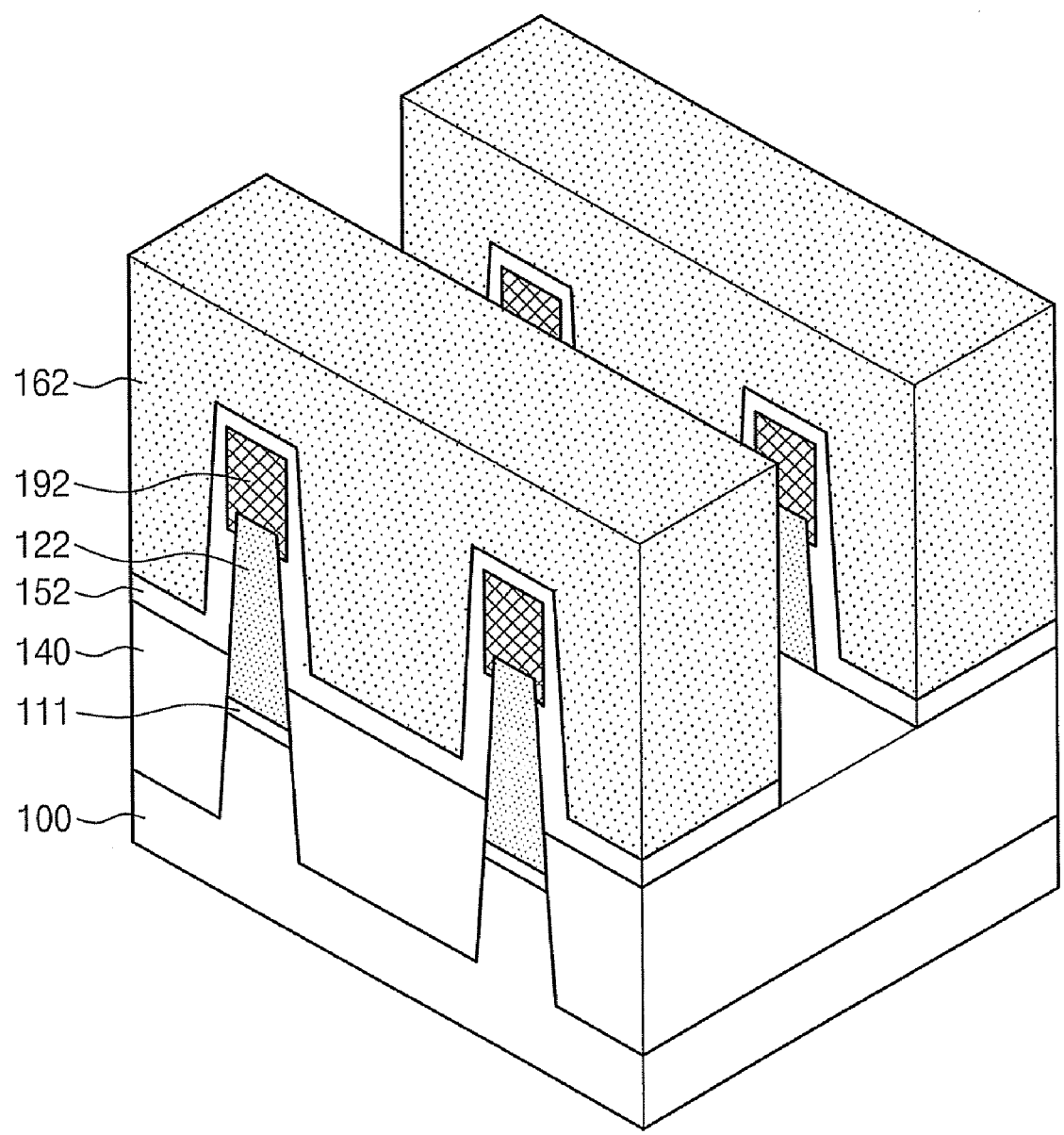
Figure 17:
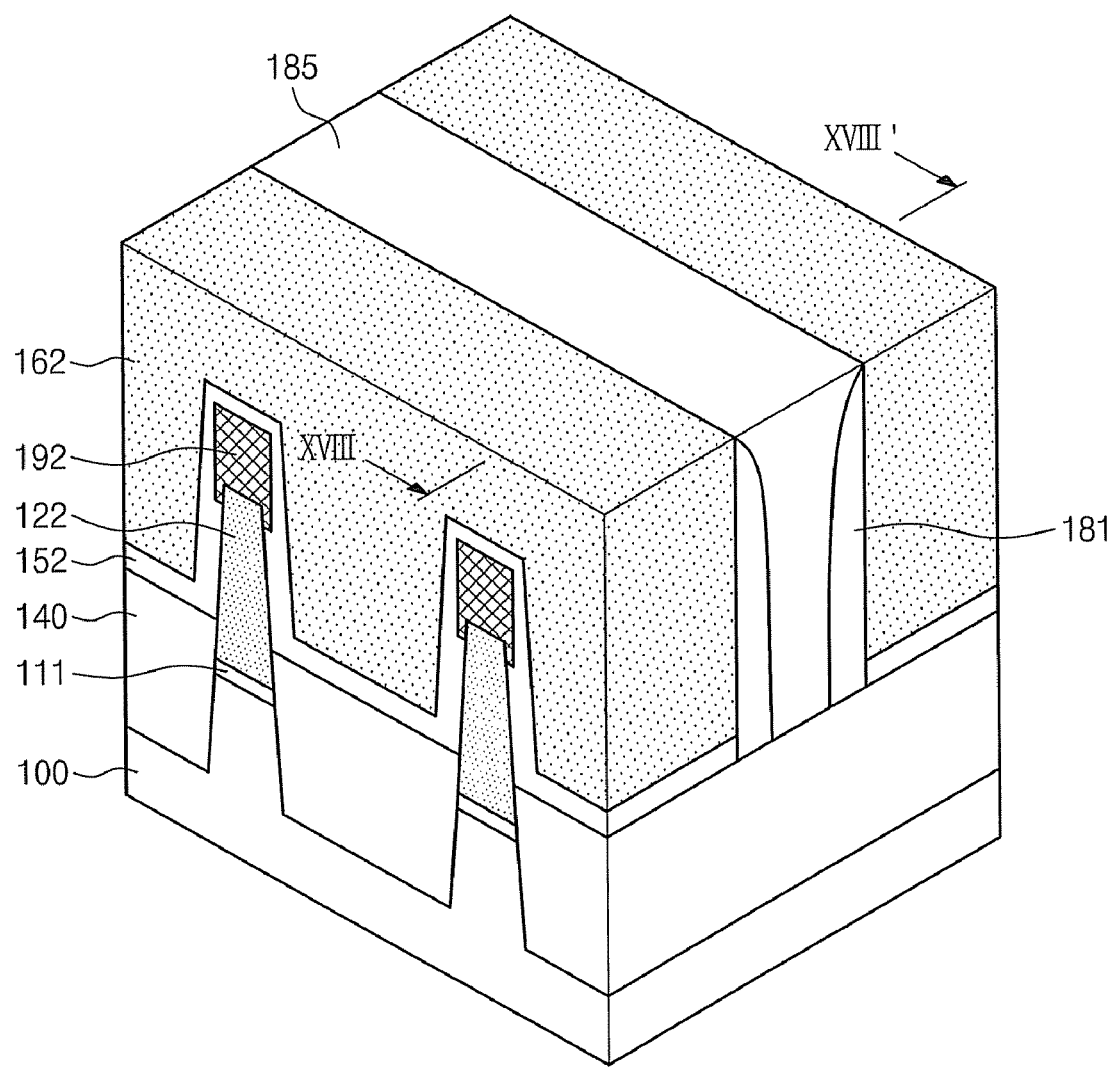
Figure 18:
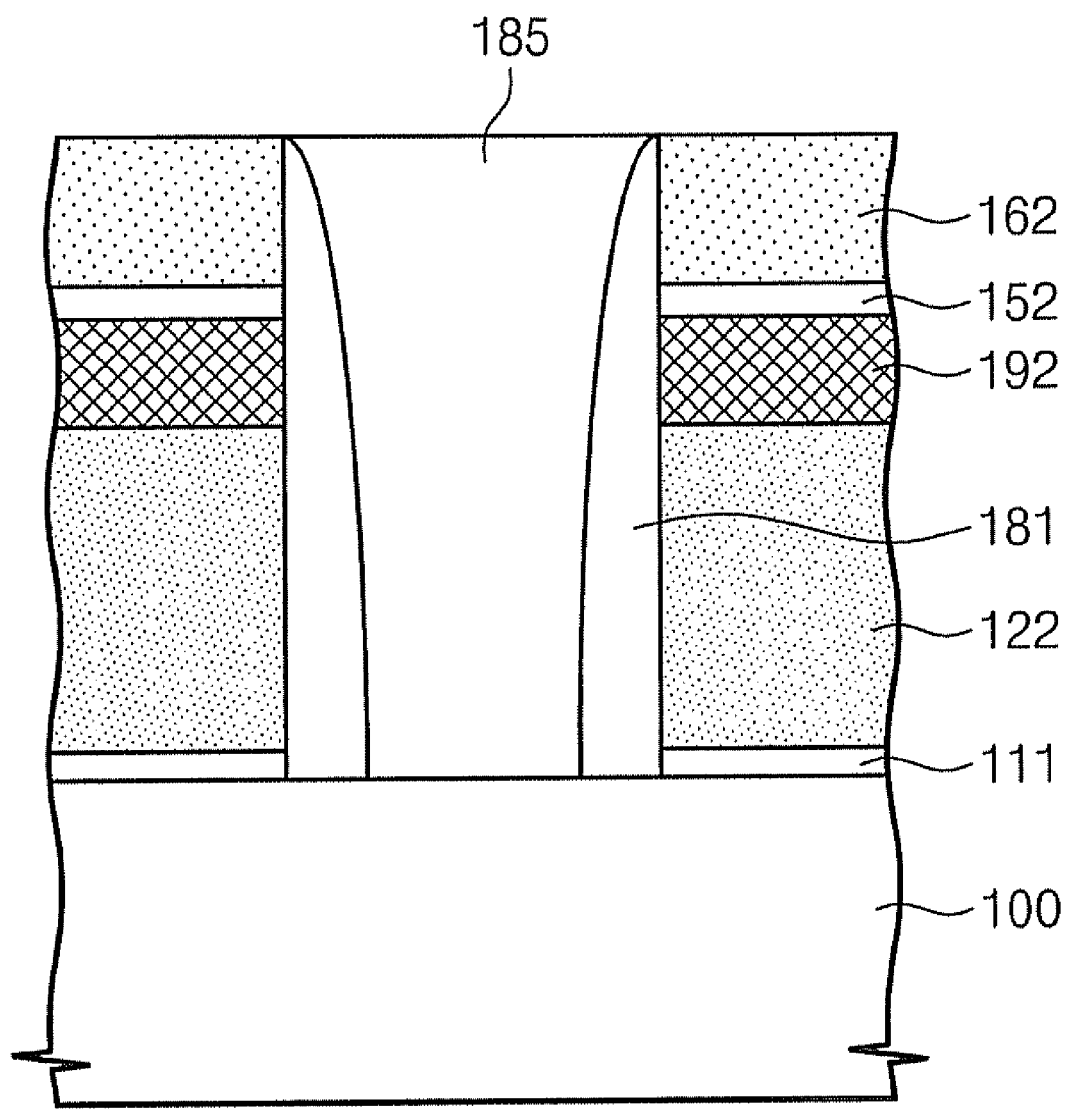

Referring to FIG. 16, a low-k dielectric material may be deposited into at least a portion of the air spacer 175 to form a low-k region 192. The low-k dielectric material may at least partially fill the air spacer 175. The low-k material may have a smaller dielectric constant than a silicon oxide. For example, the low-k material may include a silicon oxide fluoride and/or a silicon oxide carbide. The low-k region 192 may be formed by, for example, a CVD process. The width and height of the low-k region 192 may be varied according to the degree that electric fields concentrate on the top of the floating gate 122. FIG. 18 is a cross-sectional view taken along line XVIII-XVIII' of FIG. 17. Referring to FIGS. 17 and 18, an insulation spacer 181 may be formed in a recess region. The insulation spacer 181 may be, for example, a silicon nitride. A third insulation layer 185 may be in the recess region. The third insulation layer 185 may be, for example, a silicon oxide layer.

Example embodiments of the inventive concepts may provide a low-k region (e.g., a low-k region 192) between a floating gate (e.g., a floating gate region 122) and a gate insulation layer (e.g., a gate insulation layer 152). According to example embodiments of the inventive concepts, a non-volatile memory device may include a low-k region and a phenomenon of electric fields concentrating on a top surface of a floating gate may be alleviated.

FIGS. 19-25 are diagrams illustrating non-volatile memory devices and methods of manufacturing the same according to example embodiments of the inventive concepts. Example embodiments of the inventive concepts illustrated in FIGS. 19-25 may be similar to example embodiments illustrated in FIGS. 1-8, and may differ with respect to methods of forming a low-k region. Accordingly, like features may be represented by like reference characters and description thereof may be omitted.

Figure 19:
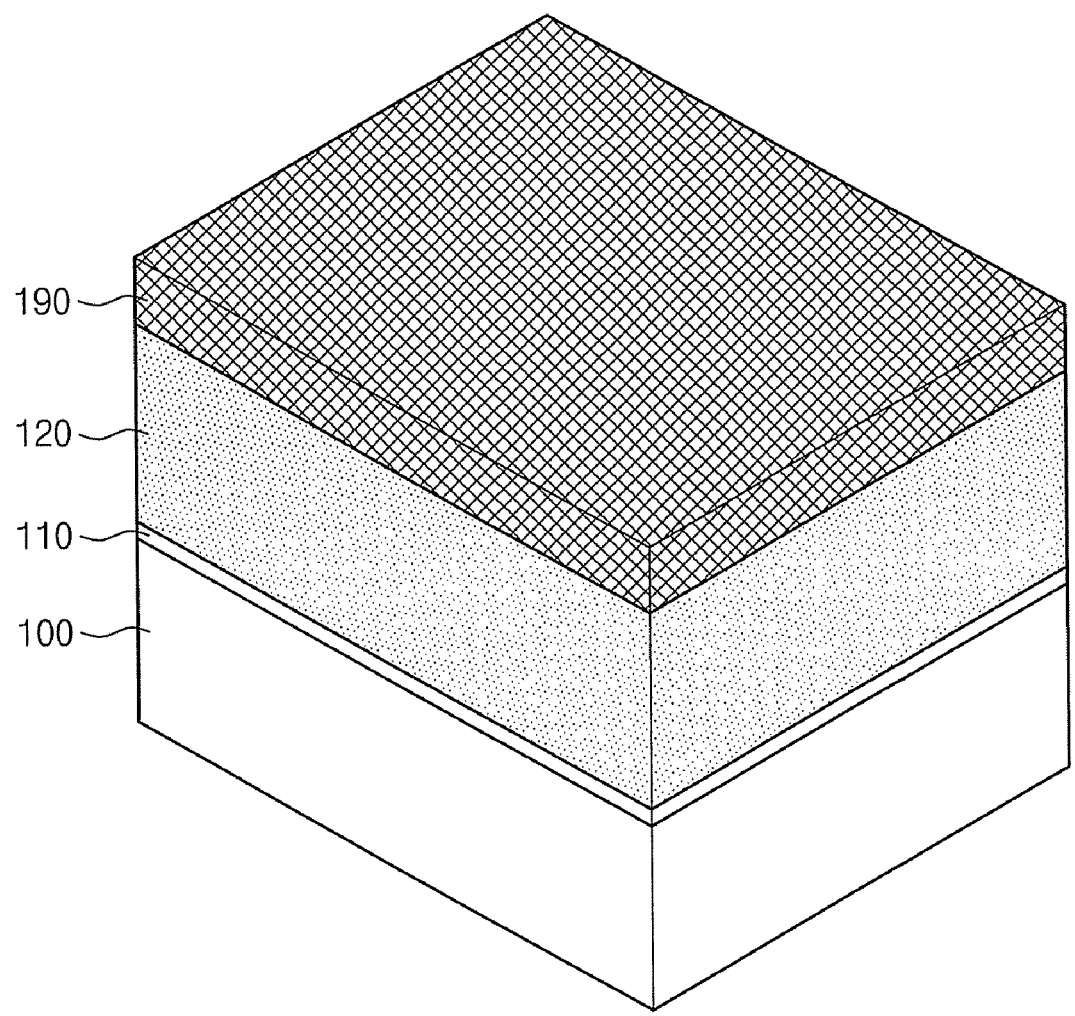

Referring to FIG. 19, a first insulation layer 110 may be on a substrate 100. The first insulation layer 110 may include, for example, a silicon oxide layer. A first conductive layer 120 may be on the first insulation layer 110. The first conductive layer 120 may be, for example, polysilicon doped with an impurity. A low-k layer 190 may be on the first conductive layer 120. The low-k layer 190 may be a material with a smaller dielectric constant than a silicon oxide. For example, the low-k layer 190 may include a silicon oxide fluoride and/or a silicon oxide carbide. The low-k layer 190 may be formed by, for example, a CVD process.

Figure 20:
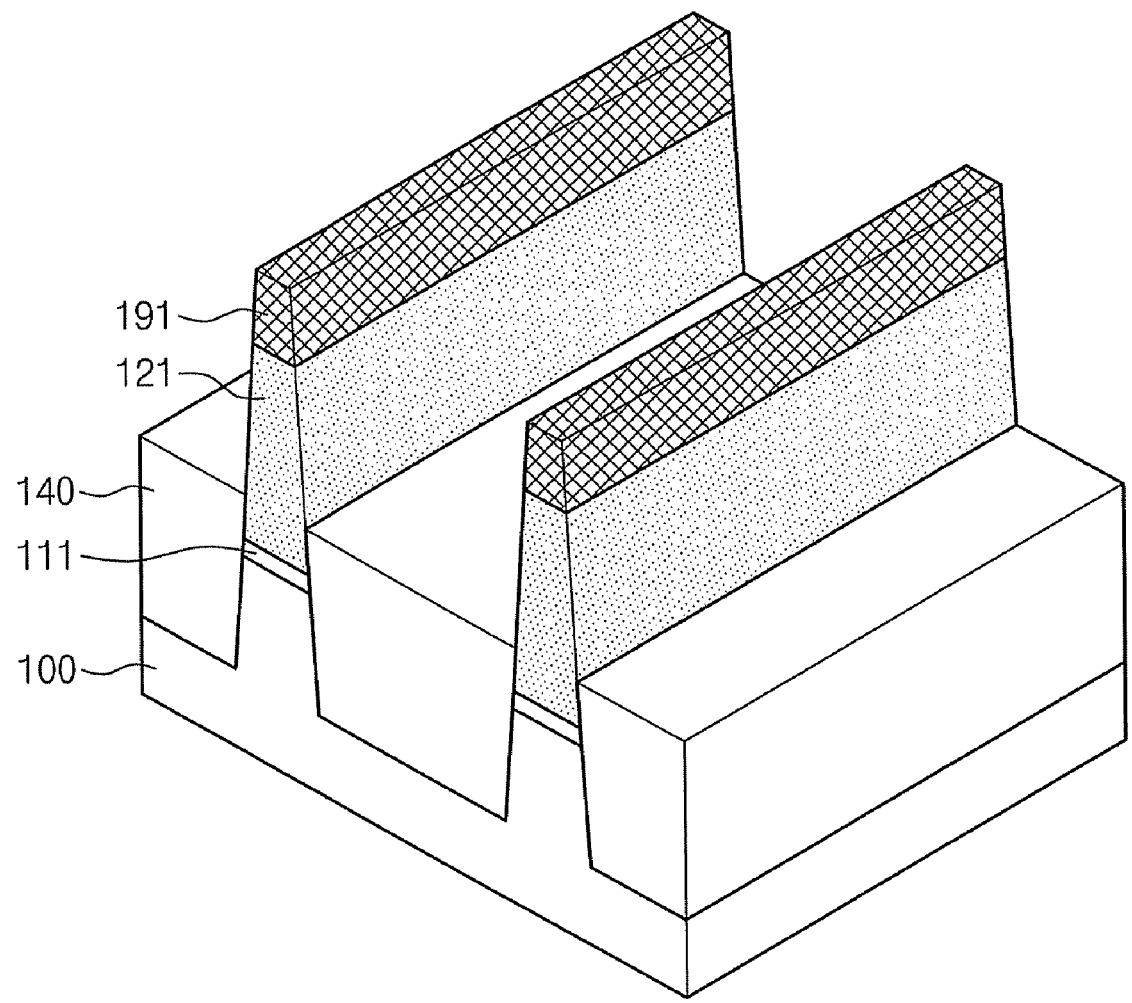
Figure 21:
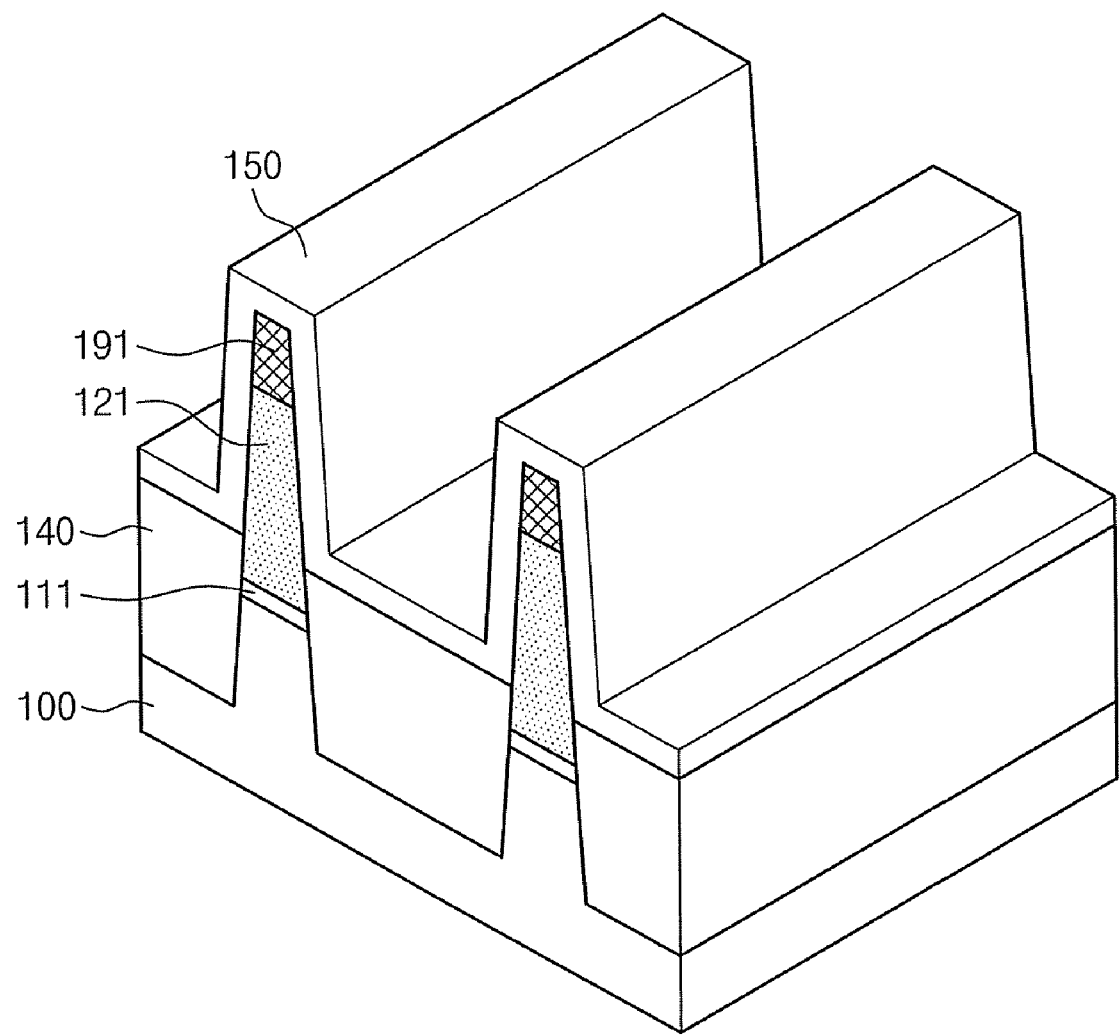

Referring to FIG. 20, the substrate 100, the first insulation layer 110, the first conductive layer 120, and the low-k layer 190 may be patterned. A tunnel insulation layer 111, a preliminary floating gate 121, and a low-k pattern 191 may be formed by the patterning. A device isolation layer 140 may be in a recess region formed by the patterning. Referring to FIG. 21, a second insulation layer 150 may be on the device isolation layer 140, the preliminary floating gate 121, and the low-k pattern 191. The second insulation layer 150 may be, for example, an ONO layer. The second insulation layer 150 may be uniformly deposited on an uneven side of the preliminary floating gate 121.

Figure 22:
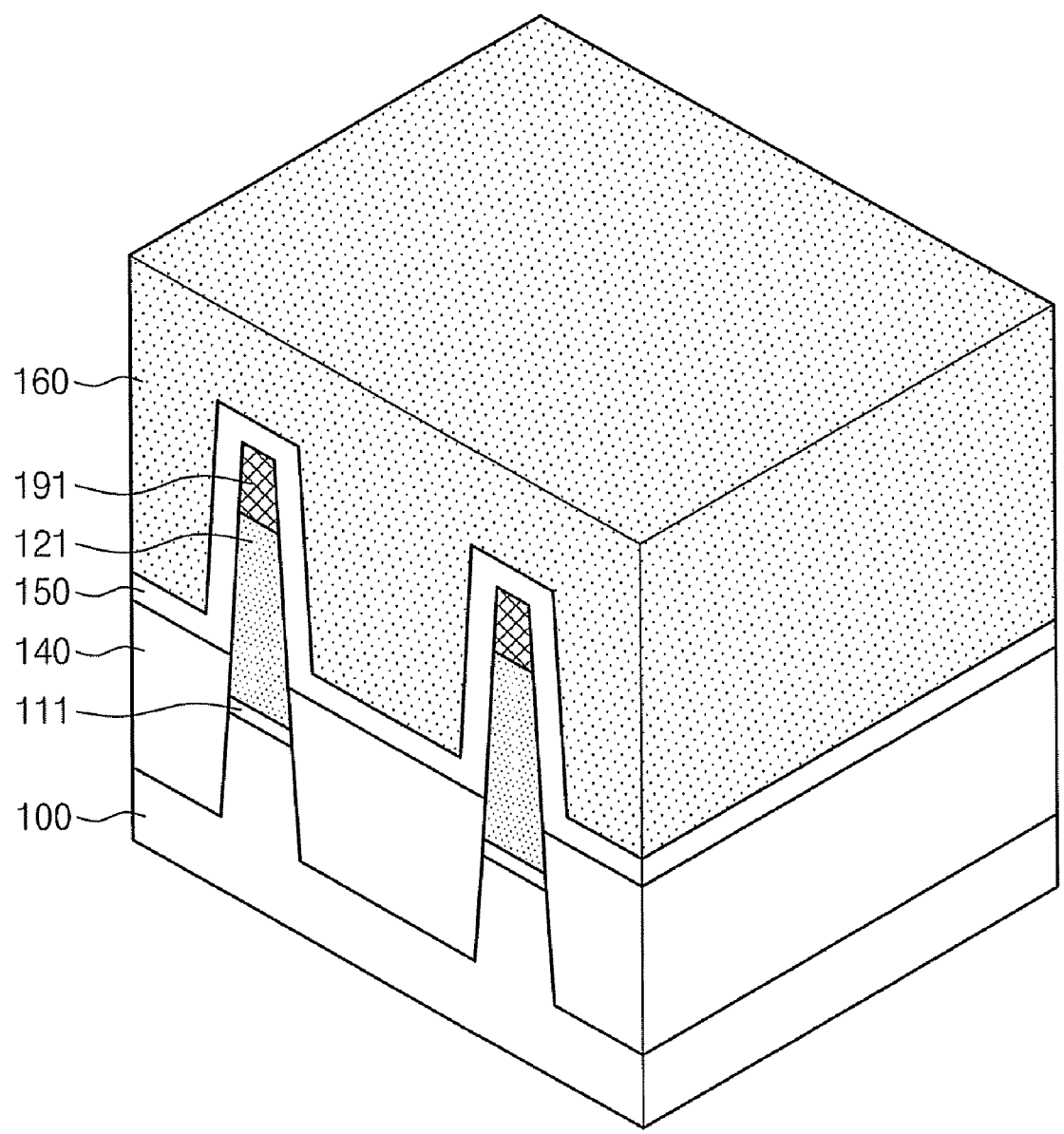
Figure 23:
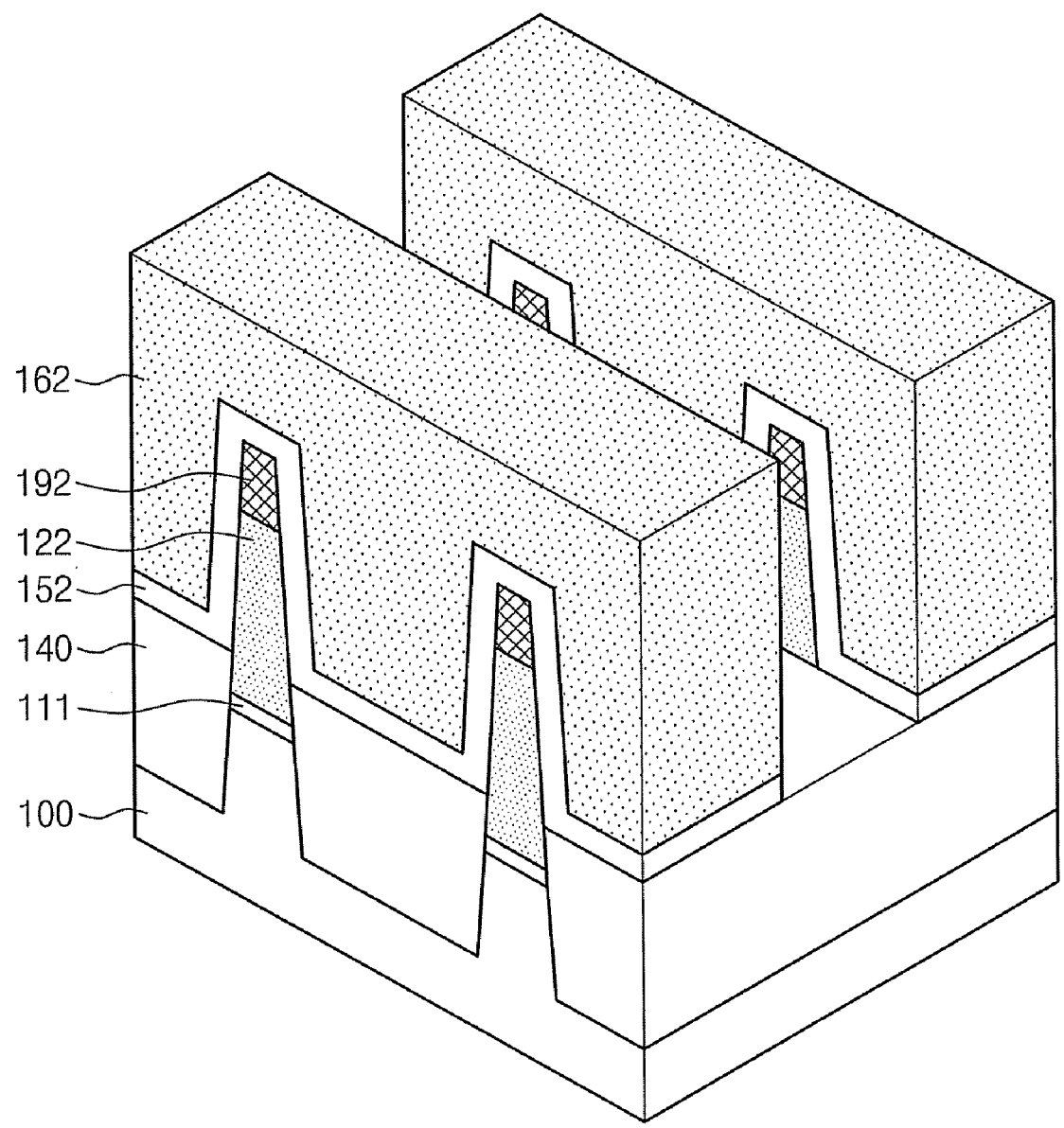
Figure 24:
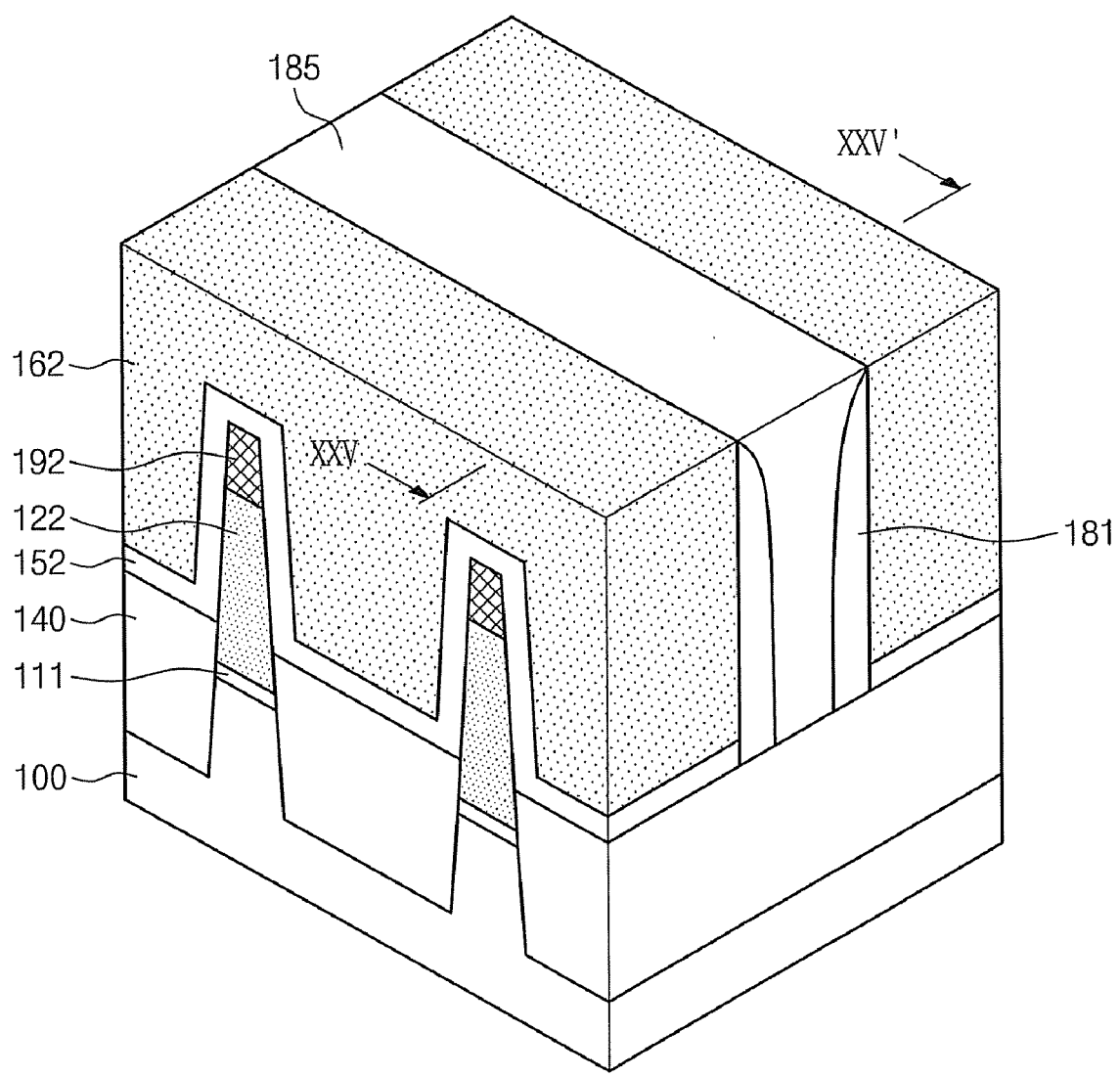
Figure 25:
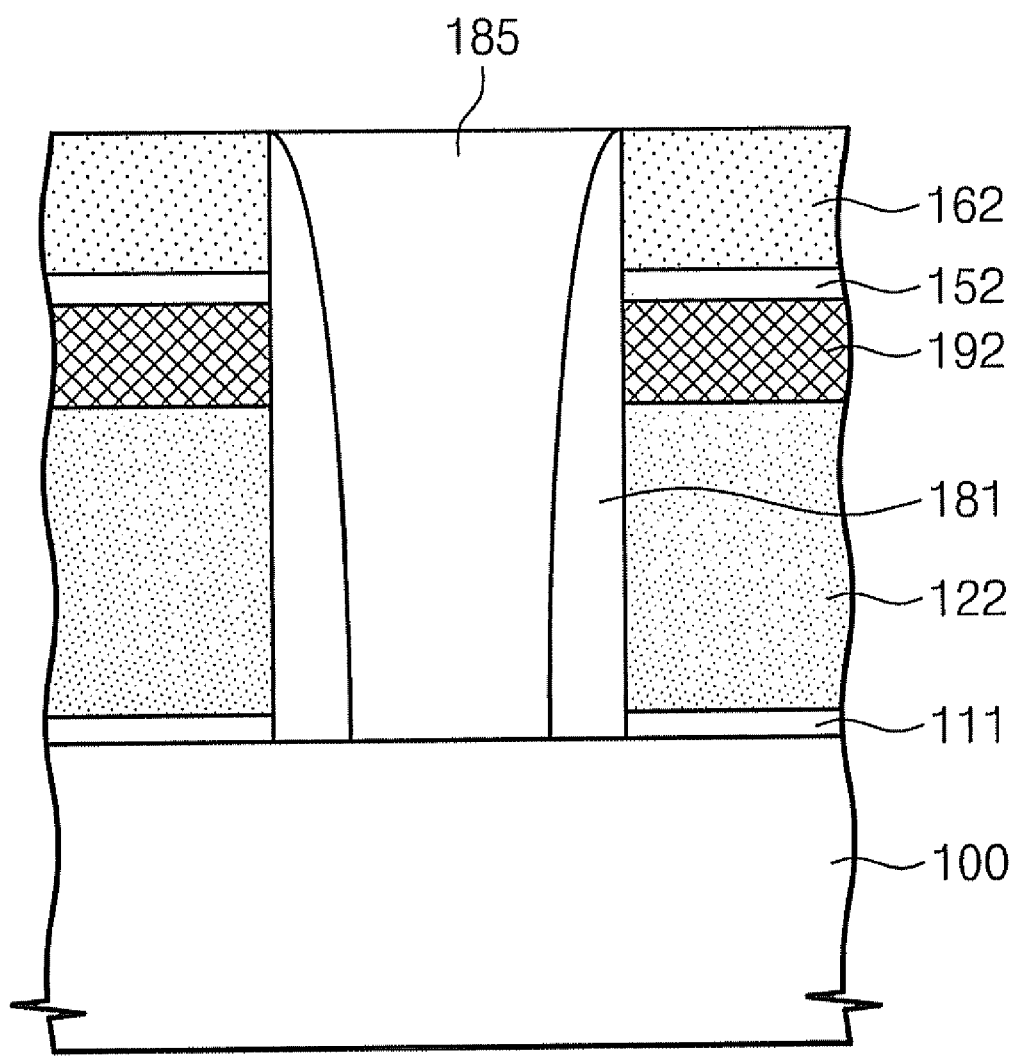

Referring to FIG. 22, a second conductive layer 160 may be on the second insulation layer 150. The second conductive layer 160 may be, for example, a doped polysilicon layer and/or a doped polycide layer. Referring to FIG. 23, the preliminary floating gate 121, the low-k pattern 191, the second insulation layer 150, and the second conductive layer 160 may be patterned. A floating gate 122, a low-k region 192, a gate insulation layer 152, and a control gate 162 may be formed by the patterning. FIG. 25 is a cross-sectional view taken along the line XXV-XXV' of FIG. 24. Referring to FIGS. 24 and 25, an insulation spacer 181 may be on a sidewall of a recess region formed by the patterning. The insulation spacer 181 may be, for example, a silicon nitride. A third insulation layer 185 may be in the recess region. The third insulation layer 185 may be, for example, a silicon oxide layer.

Example embodiments of the inventive concepts may provide a non-volatile memory device including a low-k region (e.g., a low-k region 192) between a floating gate (e.g., a floating gate 122) and a gate insulation layer (e.g., the gate insulation layer 152). According to example embodiments of the inventive concepts, a non-volatile memory device may include a low-k region and a phenomenon of electric fields concentrating on a top surface of a floating gate may be alleviated.

FIGS. 26-30 are diagrams illustrating a non-volatile memory device and methods of manufacturing the same according to example embodiments of the inventive concepts. Example embodiments of the inventive concepts illustrated in FIGS. 26-30 may be similar to example embodiments illustrated in FIGS. 1-8, and may differ with respect to methods of forming a low-k region. Accordingly, like features may be represented by like reference characters and description thereof may be omitted.

Figure 26:
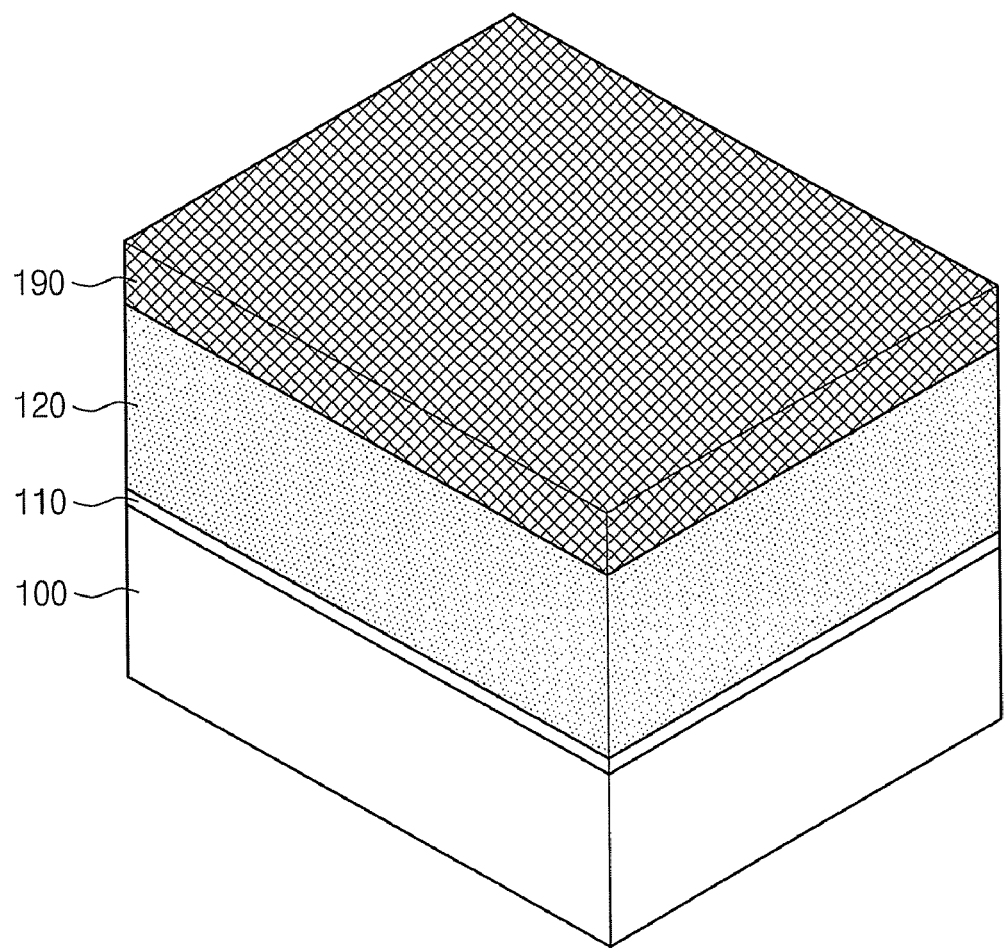

Referring to FIG. 26, a first insulation layer 110 may be on a substrate 100. The first insulation layer 110 may include, for example, a silicon oxide layer. A first conductive layer 120 may be on the first insulation layer 110. The first conductive layer 120 may be, for example, polysilicon doped with an impurity. A low-k layer 190 may be on the first conductive layer 120. The low-k layer 190 may be a material with a smaller dielectric constant than a silicon oxide. The low-k layer 190 may be, for example, a photoresist layer including a low-k material. The low-k layer 190 may include, for example, a silicon oxide fluoride and/or a silicon oxide carbide. The low-k layer 190 may be formed by, for example, spin-coating.

Figure 27:
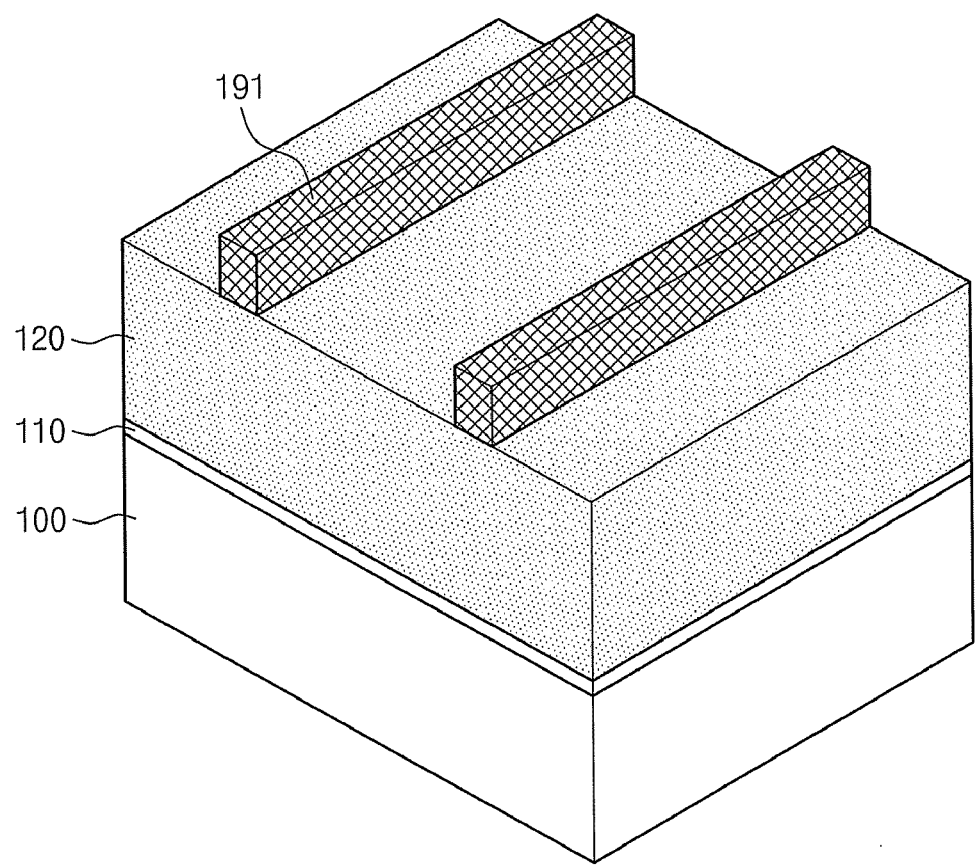
Figure 28:
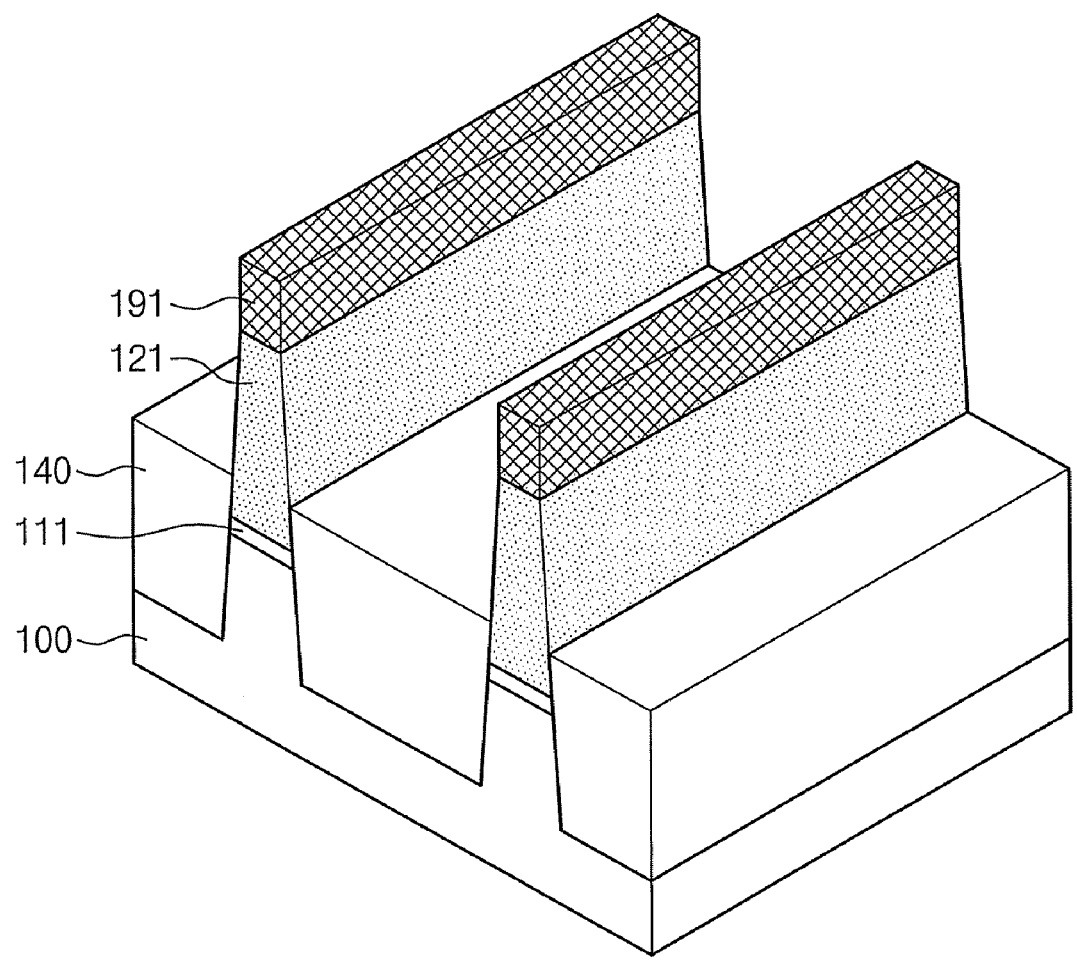
Figure 29:
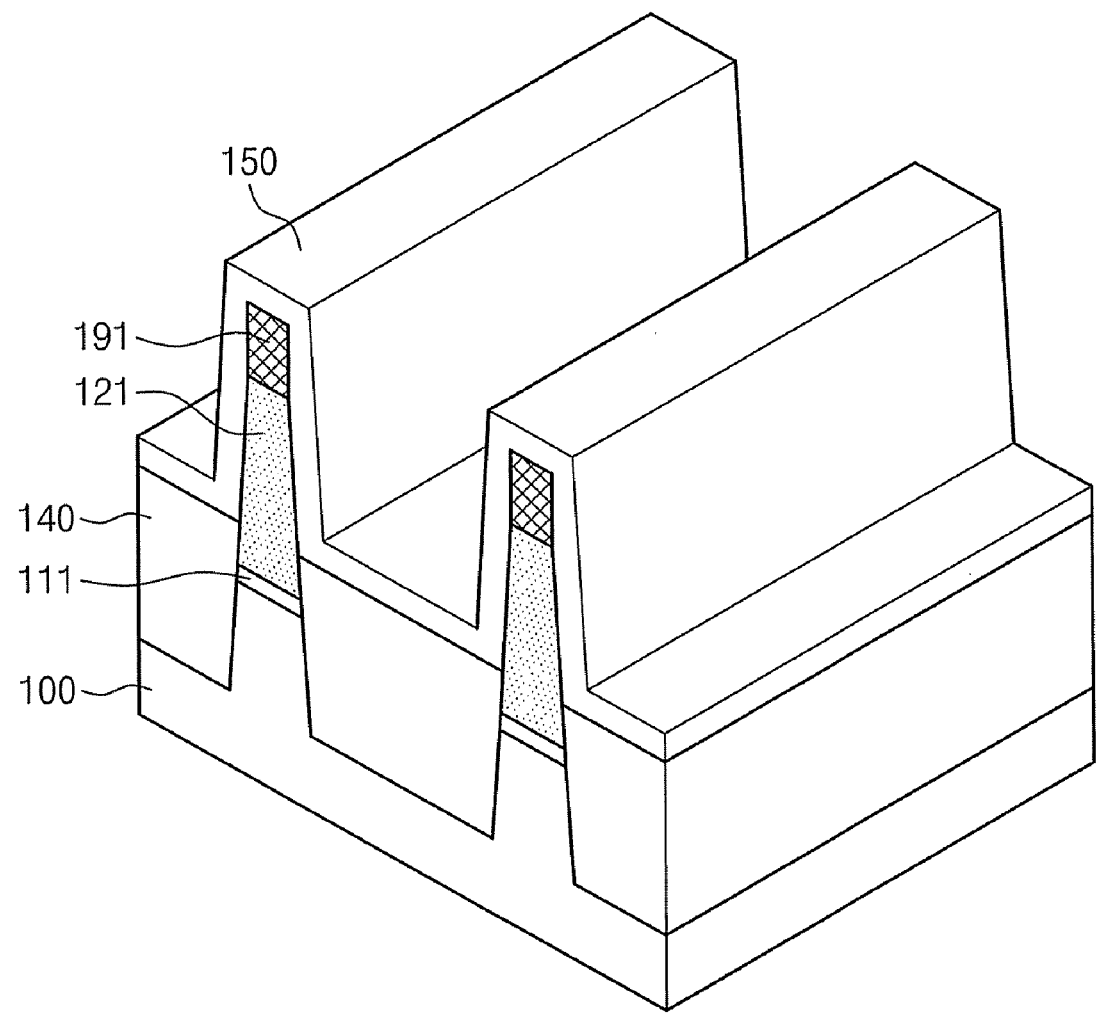

Referring to FIG. 27, the low-k layer 190 may be patterned. The patterning of the low-k layer 190 may include exposure and develop processes. A low-k pattern 191 may be formed by the patterning. Referring to FIG. 28, the substrate 100, the first insulation layer 110, and the first conductive layer 120 may be patterned by, for example, using the low-k pattern 191 as a mask. A tunnel insulation layer 111 and a preliminary floating gate 121 may be formed by the patterning. A device isolation layer 140 may be in a recess region formed by the patterning. At least a portion of the low-k pattern 191 may not be removed and may remain. Referring to FIG. 29, a second insulation layer 150 may be on the device isolation layer 140, the preliminary floating gate 121, and the low-k pattern 191. The second insulation layer 150 may be, for example, an ONO layer. The second insulation layer 150 may be uniformly deposited on an uneven side of the preliminary floating gate 121.

Figure 30:
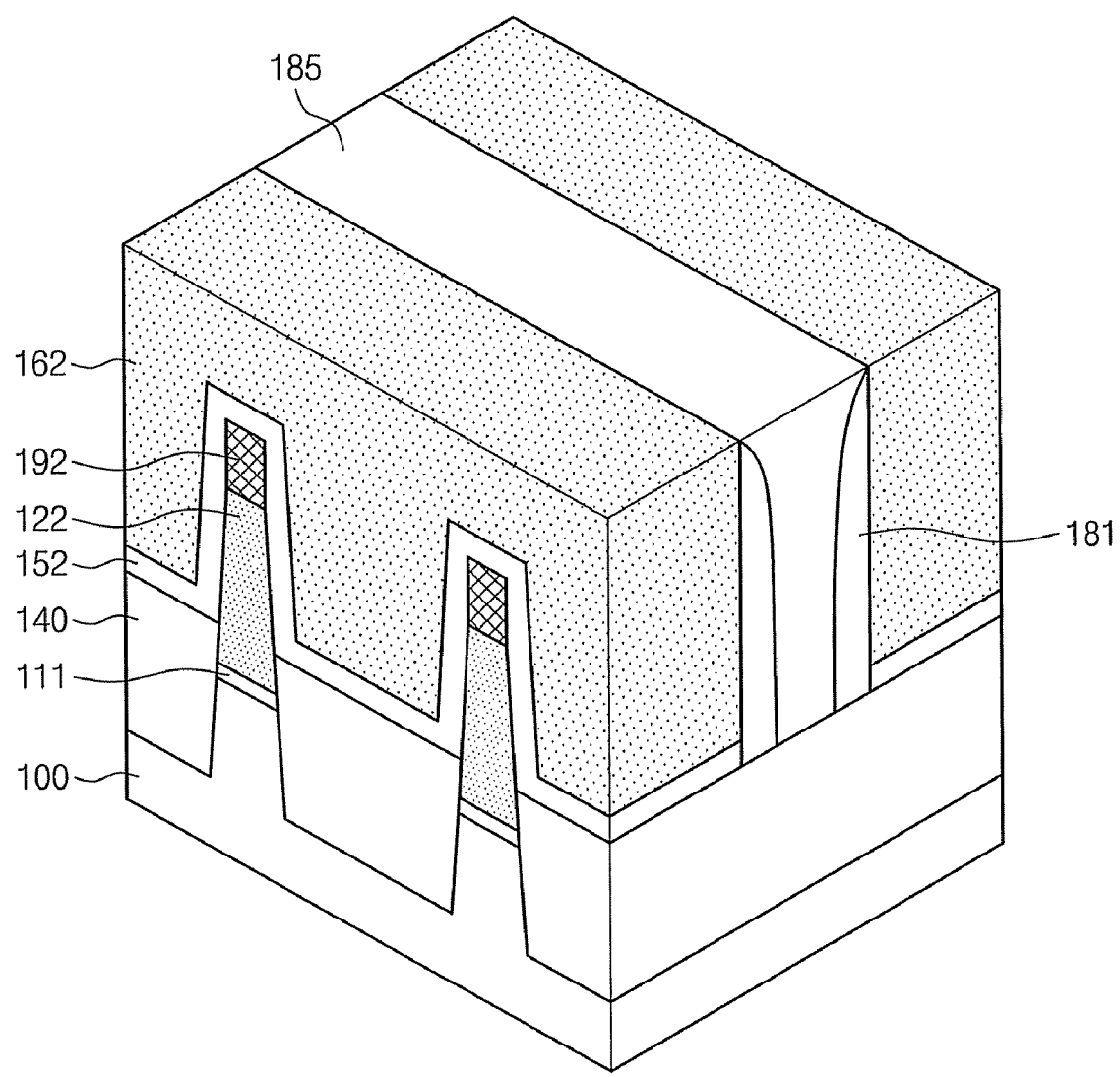

Referring to FIG. 30, a floating gate 122, a low-k region 192, a gate insulation layer 152, and a control gate 162 may be formed. The floating gate 122, the low-k region 192, the gate insulation layer 152, and the control gate 162 may be formed using, for example, a method described with reference to FIGS. 22-25. The insulation spacer 181 may be on a sidewall of the floating gate 122. The insulation spacer 181 may be, for example, a silicon nitride. A third insulation layer 185 may be between insulation spacers 181. The third insulation layer 185 may include, for example, a silicon oxide layer.

Example embodiments of the inventive concepts may provide a non-volatile memory device including a low-k region (e.g., a low-k region 192) between a floating gate (e.g., a floating gate 122) and a gate insulation layer (e.g., a gate insulation layer 152). According to example embodiments of the inventive concepts, a non-volatile memory device may include a low-k region and a phenomenon of electric fields concentrating on a top surface of a floating gate may be alleviated.

Figure 31:
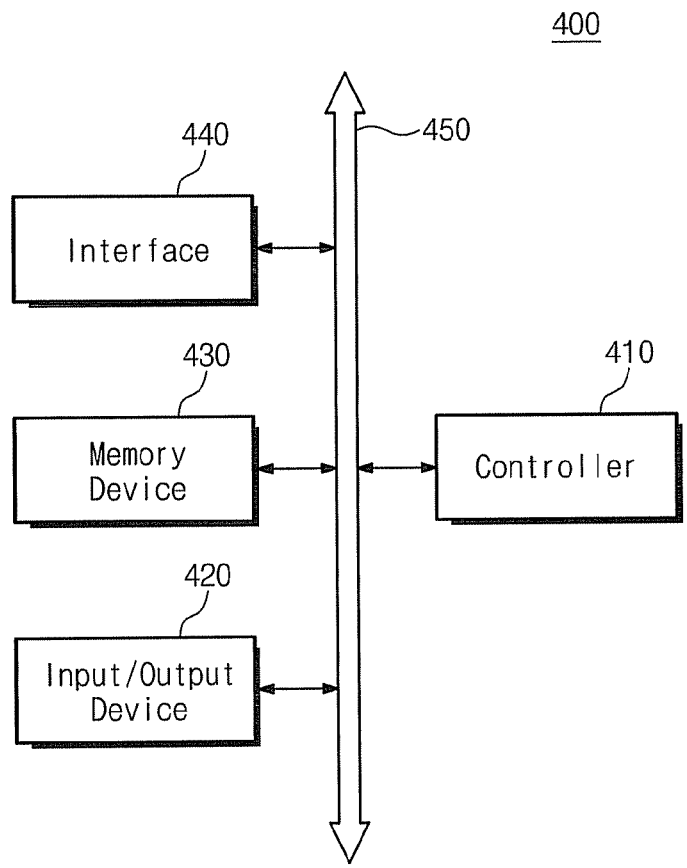

FIG. 31 is a block diagram illustrating an electronic system including a non-volatile memory device according to example embodiments of the inventive concepts. Referring to FIG. 31, the electronic system 400 may include a controller 410, an input/output device 420, and a memory device 430. The controller 410, the input/output 420, and the memory device 430 may be connected to each other through a bus 450. The bus 450 may correspond to a path though which data is transferred. The controller 410 may include at least one of a microprocessor, a digital signal processor, a microcontroller, and logic devices performing equivalent functions thereof. The input/output device 420 may include at least one of a keypad, a keyboard, and a display device. The memory device 430 may store data. The memory device 430 may store data and/or commands executed by the controller 410. The memory device 430 may include at least one of the non-volatile memory devices illustrated in FIGS. 1-30. The electronic system 400 may further include an interface 440 for transmitting data to a communication network and/or receiving data from a communication network. The interface 440 may have a wire and/or wireless form. For example, the interface 440 may include an antenna and/or a wire/wireless transceiver.

The electronic system 400 may be realized with a mobile system, a personal computer, an industrial computer, and/or a system performing various functions. For example the mobile system may be a personal digital assistant (PDA), a portable computer, a web tablet, a mobile phone, a wireless phone, a laptop computer, a memory card, a digital music system, and/or an information transmitting/receiving system. If the electronic system 400 is a device for wireless communication, it may use a communication interface protocol of the third generation communication system such as code division multiple access (CDMA), global system for mobile communications (GSM), enhanced-time division multiple access (E-TDMA), wideband code division multiple access (W-CDMA), and/or CDMA1000.

Figure 32:
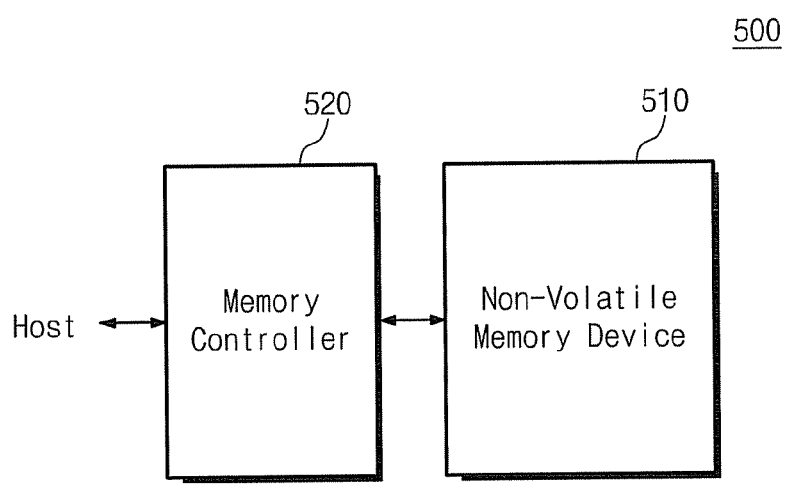

FIG. 32 is a block diagram illustrating a memory card including a non-volatile memory device according to example embodiments of the inventive concepts. Referring to FIG. 32, the memory card 500 may include a non-volatile memory device 510 and a memory controller 520. The non-volatile memory device 510 may store data and/or read the stored data. The non-volatile memory device 510 may include at least one of the non-volatile memory devices illustrated in FIGS. 1-30. The memory controller 520 may read the stored data and/or control the flash memory device 510 to store data in response to a read/write request from a host.

According to example embodiments of the inventive concepts, a leakage current caused by electric field concentration may be alleviated by forming a low-k region between a floating gate and a gate insulation layer.

While example embodiments have been particularly shown and described, it will be understood by one of ordinary skill in the art that variations in form and detail may be made therein without departing from the spirit and scope of the claims.

What is claimed is:

1. A non-volatile memory device comprising:
    a substrate;
    a tunnel insulation layer on the substrate;
    a floating gate on the tunnel insulation layer;
    a gate insulation layer on the floating gate;
    a low-dielectric constant (low-k) region between the floating gate and the gate insulation layer, the low-k region including a material having a dielectric constant less than silicon oxide and less than a dielectric constant of the gate insulation layer; and
    a control gate on the gate insulation layer.

2. The device of claim 1, wherein the low-k region is an air spacer.

3. The device of claim 1, wherein the low-k region includes at least one of a silicon oxide fluoride and a silicon oxide carbide.

4. The device of claim 1, wherein the low-k region is on an upper surface of the floating gate and on at least one sidewall of the floating gate.

5. The device of claim 4, wherein the low-k region surrounds a top of the floating gate.

6. The device of claim 1, wherein a width of the low-k region is greater than a width of an upper surface of the floating gate in a channel width direction.

7. The device of claim 1, wherein a width of the low-k region is greater than a width of an upper surface of the floating gate in a channel length direction.

8. The device of claim 7, further comprising:
    an insulation spacer on a sidewall of the floating gate,
    wherein the low-k region is between the insulation spacer and the floating gate.

9. The device of claim 1, wherein an uppermost surface of the low-k region is lower than an uppermost surface of the gate insulation layer, and a bottommost surface of the low-k region is higher than a bottommost surface of the gate insulation layer.

10. The device of claim 1, wherein the low-k region is defined by a top surface of the floating gate, a bottom surface of the gate insulation layer, and sidewalls of the gate insulation layer.

* * * * *